US009225336B2

(12) United States Patent
Aoki et al.

(10) Patent No.: US 9,225,336 B2
(45) Date of Patent: Dec. 29, 2015

(54) PROGRAMMABLE LOGIC DEVICE AND SEMICONDUCTOR DEVICE

(71) Applicant: Semiconductor Energy Laboratory Co., Ltd., Atsugi-shi, Kanagawa-ken (JP)

(72) Inventors: Takeshi Aoki, Kanagawa (JP); Takayuki Ikeda, Kanagawa (JP); Yoshiyuki Kurokawa, Kanagawa (JP); Munehiro Kozuma, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/587,588

(22) Filed: Dec. 31, 2014

(65) Prior Publication Data

US 2015/0116000 A1 Apr. 30, 2015

Related U.S. Application Data

(63) Continuation of application No. 14/166,936, filed on Jan. 29, 2014, now Pat. No. 8,952,723.

(30) Foreign Application Priority Data

Feb. 13, 2013 (JP) ................................ 2013-025087

(51) Int. Cl.
*H03K 19/177* (2006.01)
*H03K 19/0175* (2006.01)
(52) U.S. Cl.
CPC .... *H03K 19/1776* (2013.01); *H03K 19/017581* (2013.01)
(58) Field of Classification Search
None
See application file for complete search history.

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 5,744,995 | A | 4/1998 | Young |
| 5,896,047 | A | 4/1999 | Zhou |
| 5,926,466 | A | 7/1999 | Ishida et al. |

(Continued)

FOREIGN PATENT DOCUMENTS

| | | |
|---|---|---|
| EP | 0744831 A | 11/1996 |
| EP | 1146638 A | 10/2001 |

(Continued)

OTHER PUBLICATIONS

Chun.K et al., "A 3T Gain Cell Embedded DRAM Utilizing Preferential Boosting for High Density and Low Power On-Die Caches", IEEE Journal of Solid-State Circuits, Jun. 1, 2911, vol. 46, No. 6, pp. 1495-1505.

(Continued)

*Primary Examiner* — Crystal L Hammond
(74) *Attorney, Agent, or Firm* — Fish & Richardson P.C.

(57) ABSTRACT

To provide a PLD having a reduced circuit area and an increased operation speed. In the circuit structure, a gate of a transistor provided between an input terminal and an output terminal of a programmable switch element is in an electrically floating state in a period when a signal is input to the programmable switch element. The structure enables the voltage of a gate to be increased by a boosting effect in response to a signal supplied from programmable logic elements, suppressing a reduction in amplitude voltage. This can reduce a circuit area by a region occupied by a booster circuit such as a pull-up circuit and increase operation speed.

14 Claims, 18 Drawing Sheets

(56) References Cited

U.S. PATENT DOCUMENTS

| | | |
|---|---|---|
| 5,939,930 A | 8/1999 | Young |
| 5,962,881 A | 10/1999 | Young |
| 6,127,702 A | 10/2000 | Yamazaki et al. |
| 6,188,240 B1 | 2/2001 | Nakaya |
| 6,194,914 B1 | 2/2001 | Sako |
| 6,294,274 B1 | 9/2001 | Kawazoe et al. |
| 6,469,540 B2 | 10/2002 | Nakaya |
| 6,563,174 B2 | 5/2003 | Kawasaki et al. |
| 6,577,161 B2 | 6/2003 | Sun et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,323,905 B2 | 1/2008 | Madurawe |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,581,625 B2 | 11/2013 | Yoneda et al. |
| 8,669,781 B2 | 3/2014 | Ohmaru |
| 8,873,287 B2 | 10/2014 | Zaitsu et al. |
| 2001/0046027 A1 | 11/2001 | Tai et al. |
| 2001/0052793 A1 | 12/2001 | Nakaya |
| 2002/0056838 A1 | 5/2002 | Ogawa |
| 2002/0132454 A1 | 9/2002 | Ohtsu et al. |
| 2002/0190749 A1 | 12/2002 | Sun et al. |
| 2003/0057997 A1 | 3/2003 | Sun et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0181308 A1 | 8/2006 | Madurawe |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2010/0291749 A1* | 11/2010 | Or-Bach et al. ............... 438/401 |
| 2011/0187409 A1 | 8/2011 | Kitaoka |
| 2012/0212995 A1 | 8/2012 | Kurokawa |
| 2012/0293200 A1 | 11/2012 | Takemura |
| 2012/0293203 A1* | 11/2012 | Ohmaru et al. ............... 326/44 |
| 2012/0293206 A1 | 11/2012 | Yoneda et al. |
| 2012/0293209 A1 | 11/2012 | Takewaki |
| 2012/0306533 A1 | 12/2012 | Ohmaru |
| 2013/0134499 A1 | 5/2013 | Tatsumura et al. |
| 2013/0207170 A1 | 8/2013 | Kurokawa |
| 2013/0285697 A1 | 10/2013 | Kurokawa |
| 2013/0293263 A1 | 11/2013 | Kurokawa |
| 2013/0300456 A1 | 11/2013 | Lennon |
| 2013/0314124 A1 | 11/2013 | Ikeda et al. |
| 2013/0321025 A1 | 12/2013 | Kurokawa et al. |

FOREIGN PATENT DOCUMENTS

| | | |
|---|---|---|
| EP | 1355420 A | 10/2003 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 09-008627 A | 1/1997 |
| JP | 11-505377 | 5/1999 |
| JP | 2000-500947 | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2008-283526 A | 11/2008 |
| JP | 2012-257236 A | 12/2012 |

(56) References Cited

FOREIGN PATENT DOCUMENTS

| JP | 2013-070256 A | 4/2013 |
|---|---|---|
| TW | 201310915 | 3/2013 |
| WO | WO-97/39528 | 10/1997 |
| WO | WO-2004/114391 | 12/2004 |

OTHER PUBLICATIONS

Eslami.F et al., "Capacitive Boosting for FPGA Interconnection Networks", 21st International Conference on Field Programmable Logic and Applications, 2011, vol. 21, pp. 453-458.
Shukuri.S et al., "A Complementary Gain Cell Technology for sub-1 V Supply DRAMs ", IEDM 92: Technical Digest of International Electron Devices Meeting, Dec. 13, 1992, pp. 1006-1008.
Kim.W et al., "An Experimental High-Density DRAM Cell with a Built-in Gain Stage", IEEE Journal of Solid-State Circuits, Aug. 1, 1994, vol. 29, No. 8, pp. 978-981.
Shukuri.S et al., "A Semi-Static Complementary Gain Cell Technology for Sub-1 V Supply DRAM's", IEEE Trasactions on Electron Devices, Jun. 1, 1994, vol. 41, No. 6, pp. 926-931.
Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.
Asakuma.N et al., "Crystallization and Reduction of Sol-Gel-Derived Zinc Oxide Films by Irradiation with ultraviolet Lamp", Journal of Sol-Gel Science and Technology and Technology, 2003, vol. 26, pp. 181-184.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, ppp. 1067-1069.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society od Applied Physics.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn—Oxide TFT", AM-FRD '09 Digest of Technical Papers, Jul. 2009, pp. 41-44.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YBFE2O4, and YB2FE3O7 Types of Structures for Compounds in the In2O3 and SC2O3-A2O3-Bo Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4-ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

(56) References Cited

OTHER PUBLICATIONS

Lee.M et al., "15.4:Excellent Performance of Indium—Oxide-Based Thin-Film Transistors by DC Sputtering", SID Digest '09 : International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshop, Dec. 3, 2008, pp. 581-584.

Nakamura.M et al., "The phase relations in the In2O3-Ga2ZnO4-ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Phiolsophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors By Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Choi.D et al., "New Non-Volatile Memory Structures for FPGA Architectures", IEEE Transactions on Very Large Scale Integration (VLSI) Systems, Jul. 1, 2008, vol. 16 ,No. 7, pp. 874-881, IEEE.

International Search Report (Application No. PCT/JP2014/052818) Dated May 13, 2014.

Written Opinion (Application No. PCT/JP2014/052818) Dated May 13, 2014.

\* cited by examiner

PROGRAMMABLE LOGIC DEVICE AND SEMICONDUCTOR DEVICE

CROSS-REFERENCE TO RELATED APPLICATIONS

This application is a continuation of U.S. application Ser. No. 14/166,936, filed Jan. 29, 2014, now allowed, which claims the benefit of a foreign priority application filed in Japan as Serial No. 2013-025087 on Feb. 13, 2013, both of which are incorporated by reference.

TECHNICAL FIELD

The present invention relates to an object, a method, or a manufacturing method. The present invention relates to a process, a machine, manufacture, or a composition of matter. In particular, the present invention relates to, for example, a semiconductor device, a display device, a light-emitting device, a power storage device, a driving method thereof, or a fabrication method thereof. One embodiment of the present invention particularly relates to a programmable logic device in which the circuit structure can be changed and a semiconductor device or the like including the programmable logic device.

BACKGROUND ART

A programmable logic device (PLD) includes a plurality of programmable logic elements and a plurality of programmable switch elements. A circuit structure and a function of the PLD can be varied by changing a function of each programmable logic element or a connection between programmable logic elements that is established with programmable switch elements by programming performed by a user after fabrication.

Data (configuration data) for setting a function of a programmable logic element and a connection established with programmable switch elements are stored in a memory device such as a flash memory. To write the configuration data stored in the memory device to a programmable logic element and a programmable switch element is referred to as configuration.

A dynamic reconfiguration technology in which the circuit structure of a PLD where configuration has been performed is dynamically changed while a system including the PLD operates is known.

A multi-context method is known as a dynamic reconfiguration method. The multi-context method is a method for changing the circuit structure of a PLD by storing sets of configuration data corresponding to a plurality of circuit structures and selecting the set of configuration data to be used. A set of configuration data representing circuit structure data is referred to as a context. A signal for switching circuit structure data is referred to as a context selection signal.

Examples of a circuit of a programmable switch element for a multi-context method are a circuit including logic gates, a circuit including a transmission gate, and a circuit including a pass transistor (for example, see Patent Document 1).

Note that a transmission gate is a circuit used as a switch by connecting terminals serving as sources and drains of an n-channel transistor and a p-channel transistor and applying signals logically inverted from each other to gates. A pass transistor is a circuit that selects conduction or non-conduction between a source and a drain in response to a signal applied to a gate.

REFERENCE

[Patent Document 1] Japanese Published Patent Application No. 2008-283526

DISCLOSURE OF INVENTION

In the case of using a pass transistor as a programmable switch element, the amplitude voltage of a signal applied between programmable logic elements via the programmable switch element is reduced by the threshold voltage of the pass transistor. Providing, on the output terminal side, a booster circuit such as a pull-up circuit for recovering a reduced amplitude voltage to an original amplitude voltage is effective as a measure against a reduction in amplitude voltage.

However, a structure where a pull-up circuit or the like is additionally provided on the output terminal side of a programmable switch element so that a reduced amplitude voltage is recovered to an original amplitude voltage might increase a circuit area and inhibit rapid operation of a PLD.

In other structures where a programmable switch element includes logic gates in combination and where a transmission gate is used as a programmable switch element, a problem of a reduction in the amplitude voltage of a signal that passes between programmable logic elements via the programmable switch element is solved, while the number of stages of gates and a circuit area are increased, leading to a larger circuit scale of a PLD.

In view of the above, an object of one embodiment of the present invention is to provide a programmable logic device or the like with a novel structure that has a reduced circuit area. Another object of one embodiment of the present invention is to provide a programmable logic device or the like with a novel structure that can operate at high speed. Another object of one embodiment of the present invention is to provide a programmable logic device or the like with a novel structure that can achieve lower power consumption. Another object of one embodiment of the present invention is to provide a highly reliable programmable logic device or the like with a novel structure. Another object of one embodiment of the present invention is to provide a novel semiconductor device or the like.

Note that the descriptions of these objects do not disturb the existence of other objects. Note that one embodiment of the present invention does not necessarily achieve all the objects. Objects other than the above objects will be apparent from and can be derived from the descriptions of the specification, the drawings, the claims, and the like.

One embodiment of the present invention is a circuit structure in which a gate of a transistor provided between an input terminal and an output terminal of a programmable switch element is in an electrically floating state in a period when a signal is input to the programmable switch element. With the structure, the voltage of a gate is increased by a boosting effect in response to a signal supplied from a programmable logic element to the programmable switch element, suppressing a reduction in amplitude voltage.

Specifically, a gate of a transistor that controls electrical continuity between programmable logic elements to transmit a signal is connected to another transistor that is off in a period when a signal is applied between an input terminal and an output terminal of a programmable switch element. The gate of the transistor that controls electrical continuity between the programmable logic elements to transmit the signal is brought into an electrically floating state to cause a boosting effect.

One embodiment of the present invention is a programmable logic device including a programmable switch element that includes a first transistor, a second transistor, a third transistor, and a fourth transistor. A gate of the first transistor is electrically connected to a word line, and one of a source and a drain of the first transistor is electrically connected to a wiring that supplies configuration data. A gate of the second transistor is electrically connected to a storage portion, and one of a source and a drain of the second transistor is electrically connected to an input terminal. A gate of the third transistor is electrically connected to a wiring that supplies a high power supply potential, and one of a source and a drain of the third transistor is electrically connected to a wiring that applies a context selection signal. A gate of a fourth transistor is electrically connected to the other of the source and the drain of the third transistor, one of a source and a drain of the fourth transistor is electrically connected to the other of the source and the drain of the second transistor, and the other of the source and the drain of the fourth transistor is electrically connected to an output terminal. The gate of the second transistor and the gate of the fourth transistor are in an electrically floating state in a period when there is electrical continuity between the input terminal and the output terminal.

In one embodiment of the present invention, the first transistor and the third transistor are each preferably a transistor whose channel formation region is included in an oxide semiconductor film.

In one embodiment of the present invention, the oxide semiconductor film preferably contains In, Ga, and Zn.

According to one embodiment, the programmable logic device can be provided that can suppress a reduction in amplitude voltage of a signal applied between programmable logic elements and can have a circuit area reduced by a region occupied by a booster circuit such as a pull-up circuit and an increased operation speed.

BEST MODE FOR CARRYING OUT THE INVENTION

Figure 1:
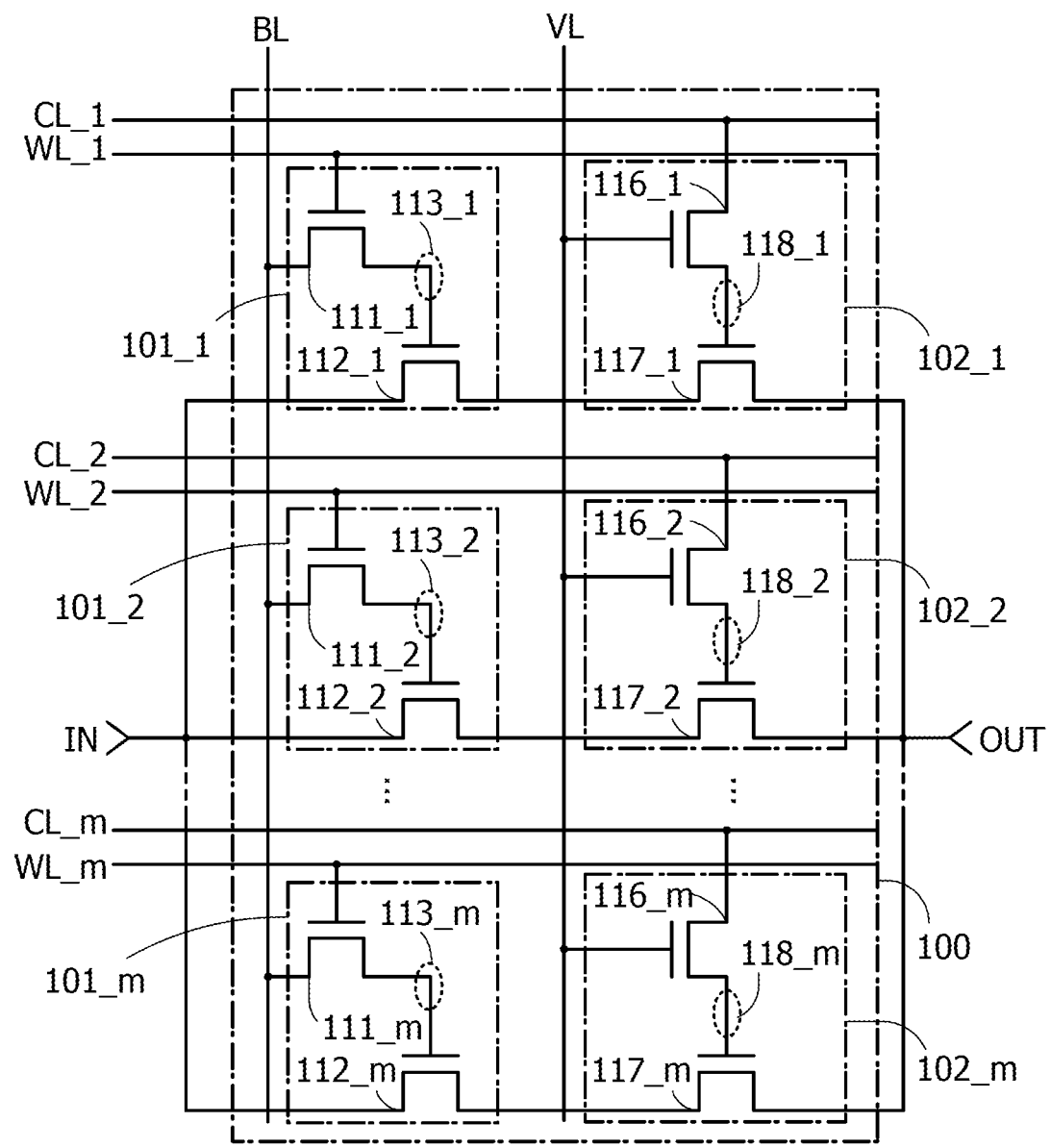
FIG. 1 is a circuit diagram illustrating a circuit structure of a programmable switch element.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following descriptions of the embodiments. Note that identical portions in the structure of the present invention that will be described below are denoted by the same reference numerals in different drawings.

In the drawings, the size, the thicknesses of layers, and/or regions may be exaggerated for clarity in some cases. Therefore, embodiments of the present invention are not limited to such scales. Note that drawings are schematic views of ideal examples, and the embodiments of the present invention are not limited to the shape or the value illustrated in the drawings. For example, variation in signal, voltage, or current due to noise or difference in timing can be included.

Note that in this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain, the channel region, and the source.

Here, since the source and the drain of the transistor change depending on the structure, the operating condition, and the like of the transistor, it is difficult to define which is a source or a drain. Thus, a portion which functions as the source and a portion which functions as the drain are not called a source and a drain, and one of the source and the drain is referred to as a first electrode and the other thereof is referred to as a second electrode in some cases.

Note that in this specification, ordinal numbers such as "first", "second", and "third" are used in order to avoid confusion among components, and the terms do not limit the components numerically.

Note that in this specification, the phrase "A and B are connected" or "A is connected to B" means the case where A and B are electrically connected to each other in addition to the case where A and B are directly connected to each other. Here, the phrase "A and B are electrically connected" or "A is electrically connected to B" means the following case: when an object having any electrical function exists between A and B, an electric signal can be transmitted and received between A and B.

Note that in this specification, terms for describing arrangement, such as "over" "above", "under", and "below", are used for convenience in describing a positional relation between components with reference to drawings. Further, a positional relation between components is changed as appropriate in accordance with a direction in which each component is described. Thus, such a positional relation between components is not limited to the terms used in this specification, and can be described appropriately depending on the situation.

Note that the layout of circuit blocks in a block diagram in a drawing specifies the positional relation for description. Thus, even when a drawing shows that different functions are achieved in different circuit blocks, an actual circuit or region may be configured so that the different functions are achieved in the same circuit block. Further, a function of each circuit block in a block diagram in a drawing is specified for description. Thus, even when one circuit block is illustrated, an actual circuit or region may be configured so that such processing as being performed in the one circuit block is performed in a plurality of circuit blocks.

In this specification and the like, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification and the like, the trigonal and rhombohedral crystal systems are included in the hexagonal crystal system.

In this specification, embodiments of the present invention will be described with reference to the drawings. Embodiments will be described in the following order.

1. Embodiment 1 (Circuit structure of programmable switch element)
2. Embodiment 2 (Structural example of circuit included in PLD)
3. Embodiment 3 (Circuit operation)
4. Embodiment 4 (Effects of one embodiment of the present invention)
5. Embodiment 5 (Oxide semiconductor)
6. Embodiment 6 (Elements included in PLD)
7. Embodiment 7 (Structural examples of an electronic component including PLD and electronic devices each provided with the electronic component)
8. Embodiment 8 (Application examples of PLD)

(Embodiment 1)

In this embodiment, a description will be given of a circuit structure of a programmable switch element included in a PLD.

A PLD in this specification refers to a circuit including a plurality of programmable logic elements and a plurality of programmable switch elements. The PLD in this specification also refers to a circuit whose structure can be varied by changing a function of each programmable logic element or a connection between programmable logic elements that is established with programmable switch elements by programming performed by a user after fabrication.

Note that programmable switch elements are provided between programmable logic elements. A programmable switch element in this specification refers to a circuit that can set a connection based on configuration data stored by configuration. In this specification, any one of sets of configuration data of the programmable switch element can be selected in response to a context selection signal.

A programmable logic element in this specification refers to a circuit that can set a plurality of functions based on configuration data stored by configuration. In this specification, any one of sets of configuration data of the programmable logic element can be selected in response to a context selection signal.

Configuration data in this specification refers to data containing data for setting a function of a programmable logic element and a connection established with programmable switch elements. Configuration in this specification refers to writing configuration data to a programmable logic element and a programmable switch element.

A context selection signal in this specification refers to data for selecting a set of configuration data to be used among sets of configuration data (context) corresponding to a plurality of circuit structures stored in a PLD in advance. A context in this specification refers to a set of configuration data representing circuit structure data.

First, a circuit structure example of a programmable switch element provided between programmable logic elements will be described with reference to FIG. 1.

A programmable switch element 100 illustrated in FIG. 1 is constituted of a set of a plurality of elements. The elements can be broadly divided into configuration data storage circuits 101_1 to 101_$m$ ($m$ is a natural number of 2 or more) and context selection circuits 102_1 to 102_$m$, according to the functions. The programmable switch element 100 is provided between an input terminal IN and an output terminal OUT that are connected to programmable logic elements.

The input terminal IN is a terminal that is supplied with an output signal of a programmable logic element. The output terminal OUT is a terminal that outputs an input signal supplied to a programmable logic element.

The configuration data storage circuits 101_1 to 101_$m$ in the programmable switch element 100 are circuits to store configuration data. The configuration data storage circuits 101_1 to 101_$m$ in the programmable switch element 100 are circuits to control electrical continuity between the input terminal and the output terminal in accordance with configuration data. In this specification, the configuration data storage circuit has a function of storing configuration data and a function of controlling electrical continuity between the input terminal and the output terminal in accordance with configuration data.

Note that an on state (conduction) in this specification refers to, for example, a state of a transistor provided between terminals where a large amount of current flows between its source and drain and the terminals are electrically connected to each other. Meanwhile, an off state (non-conduction) refers to, for example, a state of a transistor provided between terminals where a small amount of current flows between its source and drain and the terminals are not electrically connected to each other.

The context selection circuits 102_1 to 102_$m$ are circuits to control electrical continuity between the input terminal and the output terminal in response to a context selection signal in the programmable switch element 100. Note that the context selection circuit in this specification is a circuit that has a function of controlling electrical continuity between the input terminal and the output terminal in response to a context selection signal.

The configuration data storage circuits 101_1 to 101_$m$ illustrated in FIG. 1 are each constituted of a set of a plurality of elements. Each set can store configuration data. The configuration data storage circuits 101_1 to 101_$m$ are constituted of sets of respective transistors 111_1 to 111_$m$, respective transistors 112_1 to 112_$m$, and respective nodes 113_1 to 113_$m$. For example, the configuration data storage circuit 101_1 includes the transistor 111_1, the transistor 112_1, and the node 113_1.

A gate of the transistor 111_1 is connected to a word line WL_1 to which a word signal is input, and one of a source and a drain of the transistor 111_1 is connected to a bit line BL to which configuration data is input. On/off of the transistor 111_1 is controlled by a word signal of the word line WL_1. In a similar manner, the transistors 111_2 to 111__m are connected to respective word lines WL_2 to WL__m and the bit line BL. The transistors 111_1 to 111__m may also be referred to as first transistors.

The word lines WL_1 to WL__m are wirings to which word signals are input. The word signals have an H-level potential and an L-level potential and control on/off of the transistors connected to the word lines WL_1 to WL__m. The word lines WL_1 to WL__m may be simply referred to as wirings.

The bit line BL is a wiring to which configuration data is input. The configuration data input to the bit line BL have an H-level potential and an L-level potential. When any one of the transistors 111_1 to 111__m connected to the bit line BL is turned on, an H-level or L-level potential is held in a corresponding node of the nodes 113_1 to 113__m. The bit line BL may be simply referred to as a wiring.

Note that an H-level potential refers to a potential higher than an L-level potential and is, for example, a potential based on a high power supply potential VDD. An L-level potential refers to a potential lower than an H-level potential and is, for example, a potential based on a low power supply potential VSS. It is preferable that a difference between an H-level potential and an L-level potential be greater than or equal to the threshold voltage of the transistor so that switching between conduction and non-conduction of the transistor can be performed by application of an H-level or L-level potential to its gate.

Note that it is preferable to use transistors having a low leakage current in an off state (off-state current) as the transistors 111_1 to 111__m. Here, a low off-state current means that a normalized off-state current per micrometer in channel width at room temperature is lower than or equal to 10 zA. Since the off-state current is preferably as low as possible, the normalized off-state current is preferably lower than or equal to 1 zA, more preferably lower than or equal to 10 yA, still more preferably lower than or equal to 1 yA. Note that voltage between a source and a drain in that case is, for example, approximately 0.1 V, 5 V, or 10 V. An example of a transistor having such a low off-state current is a transistor including an oxide semiconductor in a channel.

In the case of the structures of the configuration data storage circuits 101_1 to 101__m illustrated in FIG. 1, the nodes 113_1 to 113__m are connected to the bit line BL by the transistors 111_1 to 111__m. On/off of the transistors 111_1 to 111__m is controlled, whereby configuration data is written and stored. Thus, it is particularly preferable to use transistors having a low off-state current as switches that suppress a potential change accompanied by the transfer of electric charge at the nodes 113_1 to 113__m in a period when configuration data is stored.

The use of transistors having a low off-state current as the transistors 111_1 to 111__m allows the configuration data storage circuits 101_1 to 101__m to be nonvolatile memories that have a data storage period after the power is shut off. Therefore, configuration data once written to the configuration data storage circuits 101_1 to 101__m can be stored in the nodes 113_1 to 113__m until the transistors 111_1 to 111__m are turned on again. This can omit processing of loading configuration data from an external memory device at the time of turning on the power, leading to reduced power consumption, a shorter starting time, and the like.

A gate of the transistor 112_1 is connected to the node 113_1, and one of a source and a drain of the transistor 112_1 is connected to the input terminal IN. On/off of the transistor 112_1 is controlled by an H-level or L-level potential held in the node 113_1. In a similar manner, the transistors 112_2 to 112__m are connected to the respective nodes 113_2 to 113__m and the input terminal IN. The transistors 112_1 to 112__m may also be referred to as second transistors.

The transistors 111_1 to 111__m and the transistors 112_1 to 112__m are n-channel transistors in FIG. 1 but may be p-channel transistors.

The node 113_1 corresponds to a node where the other of the source and the drain of the transistor 111_1 and the gate of the transistor 112_1 are connected to each other. Similarly, the node 113_2 corresponds to a node where the other of a source and a drain of the transistor 111_2 and a gate of the transistor 112_2 are connected to each other; and the node 113__m corresponds to a node where the other of a source and a drain of the transistor 111__m and a gate of the transistor 112__m are connected to each other. When the transistor 111_1 to 111m are turned off, electric charge can be stored in the nodes 113_1 to 113__m and thus configuration data can be stored.

A node in this specification refers to a connection point on a wiring that is provided to electrically connect elements, and is a part of a connecting wiring between elements, a capacitor connected to the wiring, or the like. Although being omitted in FIG. 1, a capacitor is preferably connected to the nodes 113_1 to 113__m in order that electric charge can be stored favorably.

The context selection circuits 102_1 to 102__m illustrated in FIG. 1 are each constituted of a set of a plurality of elements. A context selection signal to select one of the sets is input to each of the context selection circuits 102_1 to 102__m. Specifically, the context selection circuits 102_1 to 102__m to are constituted of sets of respective transistors 116_1 to 116__m, respective transistors 117_1 to 117__m, and respective nodes 118_1 to 118__m. For example, the context selection circuit 102_1 includes the transistor 116_1, the transistor 117_1, and the node 118_1.

A gate of the transistor 116_1 is connected to a power supply line VL supplied with a high power supply potential, and one of a source and a drain of the transistor 116_1 is connected to a selection line CL_1 to which a context selection signal is input. When a context selection signal is an H-level potential, an H-level potential is written to the node 118_1 when the transistor 116_1 is on, and the transistor 116_1 is turned off. When a context selection signal is an L-level potential, the potential of the node 118_1 becomes at an L level, so that the on state of the transistor 116_1 is controlled so as to be maintained. Similarly, the transistors 116_2 to 116__m are connected to the respective selection lines CL_2 to CL__m and the power supply line VL. The transistors 116_1 to 116__m may also be referred to as third transistors.

The power supply line VL is a wiring to which a signal of an H-level constant potential is input. The power supply line VL may also be simply referred to as a wiring.

The selection lines CL_1 to CL__m are wirings to which a context selection signal is input. For example, context selection signals input to the selection lines CL_1 to CL__m are written to the nodes 118_1 to 118__m when the transistor 116_1 to 116__m are turned on. For example, in the context selection circuit 102_1, when a context selection signal input to the selection line CL_1 is an H-level potential, the H-level potential is written to the node 118_1, so that a potential difference between a source and a drain becomes 0 and thus the transistor 116_1 is turned off. When a context selection signal input to the selection line CL_1 is an L-level potential, the transistor 116_1 remains on with the L-level potential written to the node 118_1. The selection lines CL_1 to CL_m may also be simply referred to as wirings.

A gate of the transistor 117_1 is electrically connected to the other of the source and the drain of the transistor 116_1, one of a source and a drain of the transistor 117_1 is connected to the other of the source and the drain of the transistor 112_1, and the other of the source and the drain of the transistor 117_1 is connected to the output terminal OUT. On/off of the transistor 117_1 is controlled by the potential of the node 118_1. In a similar manner, a gate of the transistor 117_2 is electrically connected to the other of a source and a drain of the transistor 116_2, one of a source and a drain of the transistor 117_2 is connected to the other of a source and a drain of the transistor 1122, and the other of the source and the drain of the transistor 1172 is connected to the output terminal OUT; and a gate of the transistor 117_m is electrically connected to the other of a source and a drain of the transistor 116_m, one of a source and a drain of the transistor 117_m is connected to the other of a source and a drain of the transistor 112_m, and the other of the source and the drain of the transistor 117_m is connected to the output terminal OUT. The transistors 117_1 to 117_m may also be referred to as fourth transistors.

The transistors 116_1 to 116_m are preferably transistors having a low leakage current in an off state (off-state current) like the transistors 111_1 to 111_m.

In the structures of the context selection circuits 102_1 to 102_m illustrated in FIG. 1, the selection lines CL1 to CL_m and the nodes 118_1 to 118_m are connected by the transistors 116_1 to 116_m. The conduction states of the transistors 116_1 to 116_m determine whether the nodes 118_1 to 118_m are in an electrically floating state. Specifically, the transistors 116_1 to 116_m are turned off when a context selection signal is at an H level and an H-level potential is written to the nodes 118_1 to 118_m. It is particularly preferable to use transistors having a low off-state current as switches that suppress a potential change accompanied by the transfer of electric charge at the nodes 118_1 to 118_m in a period when the transistors 116_1 to 116_m are off.

The transistors 116_1 to 116_m and the transistors 117_1 to 117_m are n-channel transistors in FIG. 1 but may be p-channel transistors.

The node 118_1 corresponds to a node where the other of the source and the drain of the transistor 116_1 and the gate of the transistor 117_1 are connected to each other. Similarly, the node 118_2 corresponds to a node where the other of the source and the drain of the transistor 116_2 and the gate of the transistor 117_2 are connected to each other; and the node 118_m corresponds to a node where the other of the source and the drain of the transistor 116_m and the gate of the transistor 117_m are connected to each other.

The programmable switch element 100 illustrated in FIG. 1 is configured to have a circuit structure in which the gates of the transistors 112_1 to 112_m and the transistors 117_1 to 117_m provided between the input terminal IN and the output terminal OUT are in an electrically floating state in a period when a signal is input to the input terminal IN of the programmable switch element. This structure enables the voltage of the gate to be boosted by a boosting effect in response to a signal applied between programmable logic elements. This can suppress a reduction in amplitude voltage.

Note that an electrically floating state in this specification refers to the state where an element is electrically isolated and is not electrically connected to another element or a wiring. When a node is in an electrically floating state, for example, electric charge hardly enters or leaves the node, so that the potential is increased or decreased by capacitive coupling due to a capacitance component formed at the node.

Specifically, the case of the configuration data storage circuit 101_1 and the context selection circuit 102_1 will be described. In this case, the gates of the transistor 112_1 and the transistor 117_1 that control transmission of a signal to the programmable switch element 100 are connected to the transistor 111_1 and the transistor 116_1 so that the transistors 111_1 and 116_1 can be off in a period when a signal is applied between the input terminal IN and the output terminal OUT of the programmable switch element 100. The gates of the transistor 112_1 and the transistor 117_1 that control transmission of the signal between the input terminal IN and the output terminal OUT are brought into an electrically floating state to cause a boosting effect.

Note that a boosting effect means that the potential of a gate of a transistor is increased by a variety of capacitances at the same time as the potential of one of a source and a drain is changed from an L level to an H level when the gate is in an electrically floating state. A boosting effect can vary the degree of increase in the potential of a gate due to a change in the potential of one of a source and a drain between the case where an L-level potential is held in a node connected to the gate and the case where an H-level potential is held in the node connected to the gate.

Here, descriptions will be given of an operation and an effect when a boosting effect is caused by bringing the gate of the transistor into an electrically floating state in the programmable switch element 100 illustrated in FIG. 1. Note that the case where a boosting effect is caused in the configuration data storage circuit 101_1 and the context selection circuit 102_1 illustrated in FIG. 1 will be described below. The same description applies to the configuration data storage circuits 101_2 to 101_m and the context selection circuits 102_2 to 102_m.

In the configuration data storage circuit 101_1 in FIG. 1, when the node 113_1 is floating, the potential of the node 113_1 is increased by a variety of capacitances of the transistor 112_1 at the same time as a signal input to the input terminal IN is changed from an L level to an H level.

In the case where configuration data written to the node 113_1 is "0", here, in the case where an L-level potential is held in the node 113_1, capacitance C1 generated between the gate and the one of the source and the drain of the transistor 112_1 and capacitance Cr generated between the gate and the other of the source and the drain of the transistor 112_1 contribute to an increase in the potential of the node 113_1 because the transistor 112_1 is in the weak inversion mode.

On the other hand, in the case where configuration data written to the node 113_1 is "1", here, in the case where an H-level potential is held in the node 113_1, capacitance C2 generated between the gate and a channel formation region of the transistor 112_1 as well as the capacitance C1 and the capacitance C1' contributes to an increase in the potential of the node 113_1 because the transistor 112_1 is in the strong inversion mode.

Thus, when configuration data is an H-level potential, the capacitance of the transistor 112 that contributes to an increase in the potential of the node 113_1 is larger than that when the configuration data is an L-level potential. Thus, in the configuration data storage circuits 101_1 to 101_m, a boosting effect such that the potential of the node 113_1 is increased at the same time as a change in the potential of a signal input to the input terminal IN can be obtained more significantly when configuration data is an H-level potential than when configuration data is an L-level potential.

The boosting effect described above increases the switching speed of the configuration data storage circuit 101_1 when configuration data is an H-level potential, and turns off the transistor 112_1 when configuration data is an L-level potential.

In a similar manner, in the context selection circuit 102_1 in FIG. 1, when the node 118_1 is in an electrically floating state, the potential of the node 118_1 is increased by a variety of capacitances of the transistor 117_1 at the same time as a signal input to a node between the transistor 112_1 and the transistor 117_1 is changed from an L level to an H level.

In the case where a context selection signal written to the node 118_1 is "0", here, in the case where an L-level potential is written to the node 118_1, capacitance C3 generated between the gate and the one of the source and the drain of the transistor 117_1 and capacitance C3' generated between the gate and the other of the source and the drain of the transistor 117_1 contribute to an increase in the potential of the node 118_1 because the transistor 117_1 is in the weak inversion mode.

On the other hand, in the case where a context selection signal written to the node 118_1 is "1", here, in the case where an H-level potential is written to the node 118_1, capacitance C4 generated between the gate and a channel formation region of the transistor 117_1 as well as the capacitance C3 and the capacitance C3' contributes to an increase in the potential of the node 118_1 because the transistor 117_1 is in the strong inversion mode.

Thus, when a context selection signal is an H-level potential, the capacitance of the transistor 117 that contributes to an increase in the potential of the node 118 is larger than that when the a context selection signal is an L-level potential. Thus, in the context selection circuits 102_1 to 102_m, a boosting effect such that the potential of the node 118_1 is increased at the same time as a change in the potential of a signal applied to a node between the transistor 112_1 and the transistor 117_1 can be obtained more significantly when a context selection signal is an H-level potential than when a context selection signal is an L-level potential.

The boosting effect described above increases the switching speed of the context selection circuit 102_1 when a context selection signal is an H-level potential, and turns off the transistor 117_1 when a context selection signal is an L-level potential.

To increase integration density, an n-channel transistor is used as a transistor that is included in a programmable switch element of a general PLD and serves as a switch. The switch, however, has a problem of a reduction in switching speed because the potential of a signal passing through a gate of the n-channel transistor is decreased due to the threshold voltage. There has been suggested a method in which overdriving (driving with high potential application to a gate of an n-channel transistor) is used to increase the switching speed; however, employing this method might degrade the reliability of the n-channel transistor used as the switch. In one embodiment of the present invention, however, when configuration data and a context selection signal are H-level potentials, the boosting effect can increase the switching speed of the configuration data storage circuit 101_1 and the context selection circuit 102_1 without using overdriving; consequently, it is not necessary to sacrifice the reliability to increase the switching speed.

Unlike in the case of Reference 1 (K. C. Chun, P. Jain, J. H. Lee, and C. H. Kim, "A 3T Gain Cell Embedded DRAM Utilizing Preferential Boosting for High Density and Low Power On-Die Caches", IEEE Journal of Solid-State Circuits, vol. 46, no. 6, pp. 1495-1505, June 2011) and Reference 2 (F. Eslami and M. Sima, "Capacitive Boosting for FPGA Interconnection Networks", Int. Conf. on Field Programmable Logic and Applications, 2011, pp. 453-458), the programmable switch element 100 with the structure of this embodiment is expected to have another advantageous effect.

Since Reference 1 is based on the premise that a DRAM is used, the number of memory cells is large, and a read bit line (RBL) connected to an output of the memory cell has large parasitic capacitance. On the other hand, in the case of the programmable switch element 100, a signal input to the output terminal is supplied to an input terminal of a programmable logic element; thus, parasitic capacitance of the output terminal of the programmable switch element 100 is smaller than that of Reference 1. Therefore, the programmable switch element 100 also provides a secondary boosting effect such that the potential of the signal input to the output terminal is further increased by an increase in the potential of the node 118_1 due to the capacitance C3 generated between the gate and the one of the source and the drain of the transistor 117_1 and the capacitance C3' generated between the gate and the other of the source and the drain of the transistor 117_1. That is, the secondary boosting effect described above can further increase the switching speed in the programmable switch element 100. In addition, the programmable switch element 100 can maintain the increased potential of the node with fewer transistors than in Reference 2.

As described above, one embodiment of the present invention can have a circuit structure in which a gate of a transistor provided between an input terminal and an output terminal of a programmable switch element is in an electrically floating state in a period when a signal is input to the programmable switch element. This structure enables the voltage of the gate to be boosted by a boosting effect in response to a signal applied between programmable logic elements. This can suppress a reduction in amplitude voltage.

This embodiment can be implemented in combination with any of the other embodiments as appropriate.

(Embodiment 2)

In this embodiment, a circuit structure example of a PLD, a circuit structure example of a switch circuit including the programmable switch element described in Embodiment 1, and a circuit structure example of a programmable logic element will be described.

<Structural Example of PLD>

Figure 2A:
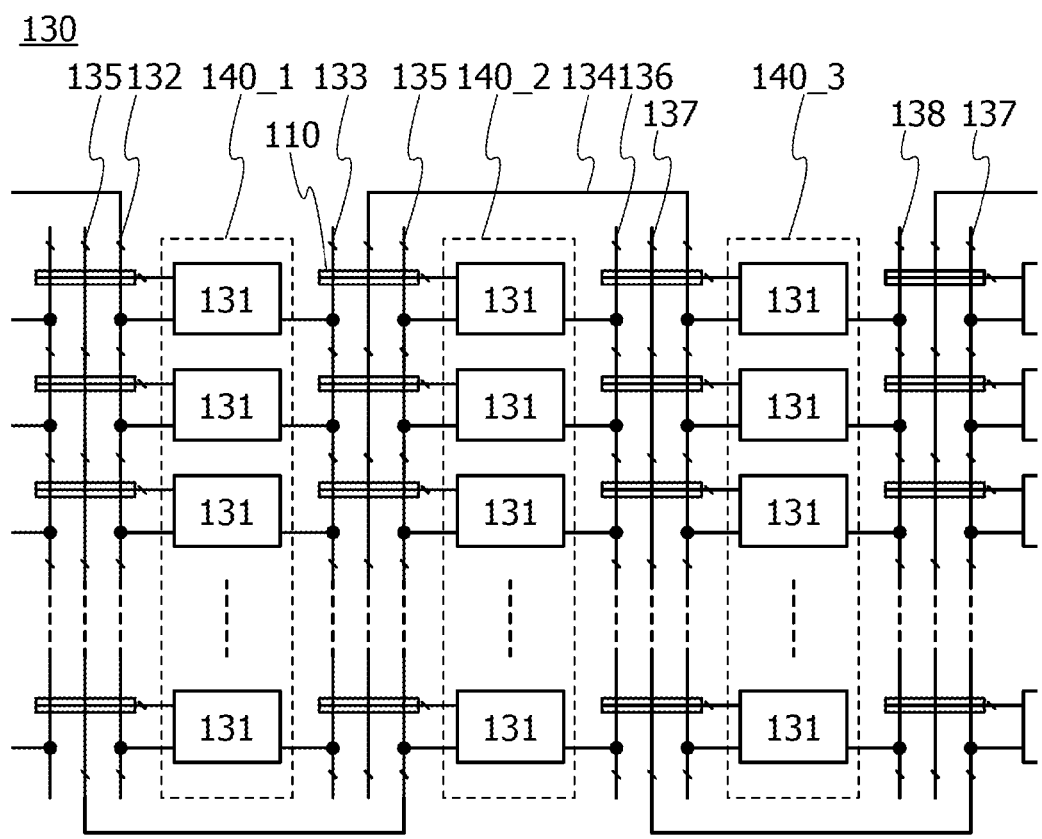
FIGS. 2A to 2C are circuit diagrams illustrating a structure of a PLD.

A structural example of a PLD of one embodiment of the present invention will be described. FIG. 2A illustrates a part of a structure of a PLD 130 of one embodiment of the present invention.

In FIG. 2A, the PLD 130 is provided with a first column 140_1 including a plurality of programmable logic elements 131, a second column 140_2 including a plurality of programmable logic elements 131, and a third column 140_3 including a plurality of programmable logic elements 131. FIG. 2A illustrates an example where the first column 140_1, the second column 140_2, and the third column 140_3 are positioned in parallel in this order from the left.

Further, in FIG. 2A, a plurality of wirings 132, a plurality of wirings 133, a plurality of wirings 134, a plurality of wirings 135, a plurality of wirings 136, a plurality of wirings 137, and a plurality of wirings 138 are provided in the PLD 130.

First output terminals of the programmable logic elements 131 in the first column 140_1 are connected to the plurality of wirings 132. Second output terminals of the programmable logic elements 131 in the first column 140_1 are connected to the plurality of wirings 133.

First output terminals of the programmable logic elements 131 in the second column 140_2 are connected to the plurality of wirings 135. Second output terminals of the programmable logic elements 131 in the second column 140_2 are connected to the plurality of wirings 136.

First output terminals of the programmable logic elements 131 in the third column 140_3 are connected to the plurality of wirings 134. Second output terminals of the programmable logic elements 131 in the third column 140_3 are connected to the plurality of wirings 138.

Note that the number of the first output terminals and the number of the second output terminals of the programmable logic element 131 are not limited to one, and either or both of the number of the first output terminals and the number of the second output terminals may be more than one. Note also that one output terminal is always connected to one wiring regardless of the number of the first output terminals and the number of the second output terminals. Thus, when one column includes Y programmable logic elements 131 (Y is a natural number), the PLD 130 at least includes Y wirings connected to the first output terminals and Y wirings connected to the second output terminals.

The first column 140_1 is positioned between the plurality of wirings 132 and the plurality of wirings 133. The second column 140_2 is positioned between the plurality of wirings 135 and the plurality of wirings 136. The third column 140_3 is positioned between the plurality of the wirings 134 and the plurality of the wirings 138.

The plurality of wirings 135, which are connected to the first output terminals of the programmable logic element 131 in the second column 140_2, are provided both between the first column 140_1 and the second column 140_2 and between the first column 140_1 and a column (not illustrated) of the programmable logic elements 131 positioned on the left side of the first column 140_1 in FIG. 2A. The plurality of wirings 134, which are connected to the first output terminals of the programmable logic elements 131 in the third column 140_3, are provided both between the first column 140_1 and the second column 140_2 and between the second column 140_2 and the third column 140_3. The plurality of wirings 137, which are connected to the first output terminals of the programmable logic elements 131 (not illustrated) positioned on the right side of the third column 140_3 in FIG. 2A, are provided both between the second column 140_2 and the third column 140_3 and between the third column 140_3 and a column (not illustrated) of the programmable logic elements 131 positioned on the right side of the third column 140_3.

When attention is focused on an N-th column (N is a natural number of 3 or more), a plurality of wirings connected to the first output terminals of the programmable logic elements 131 in the N-th column are provided both between the N-th column and an (N−1)th column and between the (N−1)th column and an (N−2)th column. In the case where N is 2, a plurality of wirings connected to the first output terminals of the programmable logic element 131 in the second column are provided both between the second column and the first column and between the first column and an IO. The IO has a function of an interface that controls input of signals to the programmable logic elements 131 from the outside of the PLD or output of signals from the programmable logic elements 131 to the outside of the PLD.

In one embodiment of the present invention, when attention is focused on the (N−1)th column (N is a natural number of 3 or more), a plurality of wirings connected to the first output terminals of the programmable logic elements 131 in the (N−1)th column, a plurality of wirings connected to the first output terminals of the programmable logic elements 131 in the N-th column, and a plurality of wirings connected to the second output terminals of the programmable logic elements 131 in the (N−2)th column are connected to a plurality of input terminals of the programmable logic elements 131 in the (N−1)th column through switch circuits 110.

Specifically, in the case of FIG. 2A for example, the plurality of wirings 135 connected to the first output terminals of the programmable logic elements 131 in the seocnd column 140_2, the plurality of wirings 134 connected to the first output terminals of the programmable logic elements 131 in the third column 140_3, and the plurality of wirings 133 connected to the second output terminals of the programmable logic elements 131 in the first column 140_1 are connected to a plurality of input terminals of the programmable logic elements 131 in the second column 140_2 through the switch circuits 110.

Figure 2B:
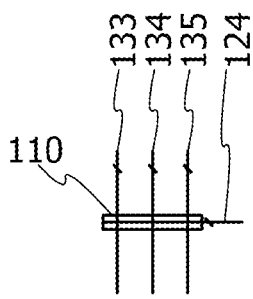

FIG. 2B is a circuit diagram of the switch circuit 110 that controls the connection between the plurality of wirings 133, the plurality of wirings 134, and the plurality of wirings 135 and the plurality of input terminals of the programmable logic elements 131 in the second column 140_2 illustrated in FIG. 2A. The plurality of wirings 124 are connected to the plurality of input terminals of the programmable logic elements 131 in the second column 140_2 in FIG. 2B.

Figure 2C:
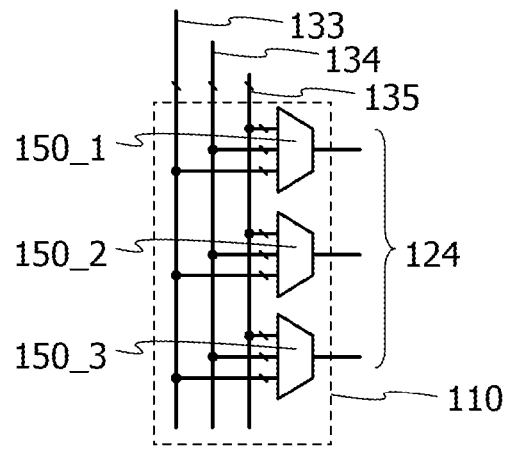

The switch circuit 110 includes the plurality of programmable switch elements described in Embodiment 1. FIG. 2C illustrates a specific structural example of the switch circuit 110 illustrated in FIG. 2B. The switch circuit 110 illustrated in FIG. 2B includes three programmable switch elements: a programmable switch element 150_1, a programmable switch element 150_2, and a programmable switch element 150_3 as illustrated in FIG. 2C.

FIG. 2C illustrates the switch circuit 110 corresponding to three wirings 124 and thus shows the case where the switch circuit 110 includes the three programmable switch elements: the programmable switch element 150_1, the programmable switch element 150_2, and the programmable switch element 150_3. The number of the programmable switch elements included in the switch circuit 110 can be determined depending on the number of input terminals of the programmable logic element 131.

FIGS. 2B and 2C illustrate the switch circuit 110, as a typical example, that controls the connection between the plurality of wirings 133, the plurality of wirings 134, and the plurality of wirings 135 and the plurality of wirings 124; another switch circuit 110 that controls a connection between a plurality of wirings and a plurality of wirings in FIG. 2A has a structure similar to the above structure.

Figure 3:
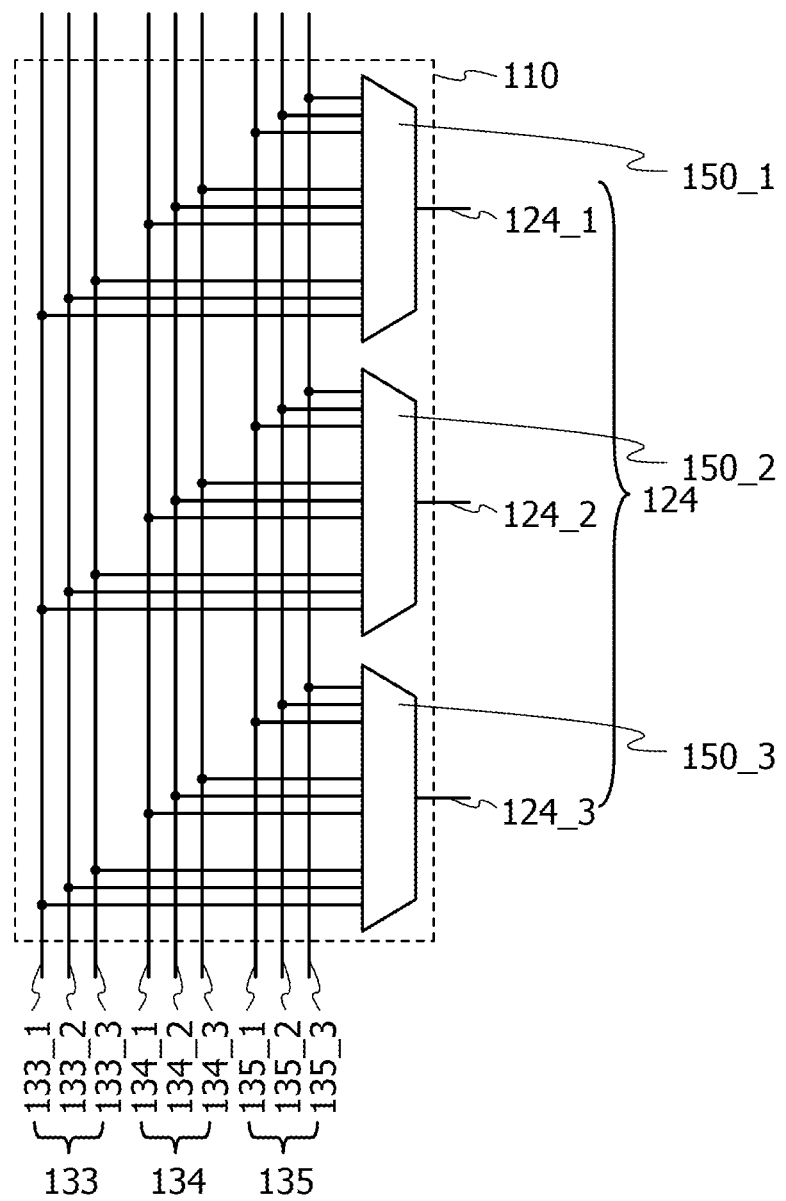
FIG. 3 is a circuit diagram of a switch circuit.

Next, FIG. 3 illustrates a more specific structural example of the switch circuit 110 in FIG. 2C. FIG. 3 more specifically illustrates a connection relation between the plurality of wirings 133, the plurality of wirings 134, and the plurality of wirings 135 and the switch circuit 110. As illustrated in FIG. 3, each of the programmable switch elements controls a connection between all the plurality of wirings 133, 134, and 135 and one of the plurality of wirings 124.

Specifically, FIG. 3 illustrates an example where the plurality of wirings 133 include a wiring 133_1, a wiring 133_2, and a wiring 133_3, the plurality of wirings 134 include a wiring 134_1, a wiring 134_2, and a wiring 134_3, the plurality of wirings 135 include a wiring 135_1, a wiring 135_2, and a wiring 135_3, and the plurality of the wirings 124 include a wiring 124_1, a wiring 124_2, and a wiring 124_3. Further, in FIG. 3, the programmable switch element 150_1, the programmable switch element 150_2, and the programmable switch element 150_3 are provided.

Figure 4:
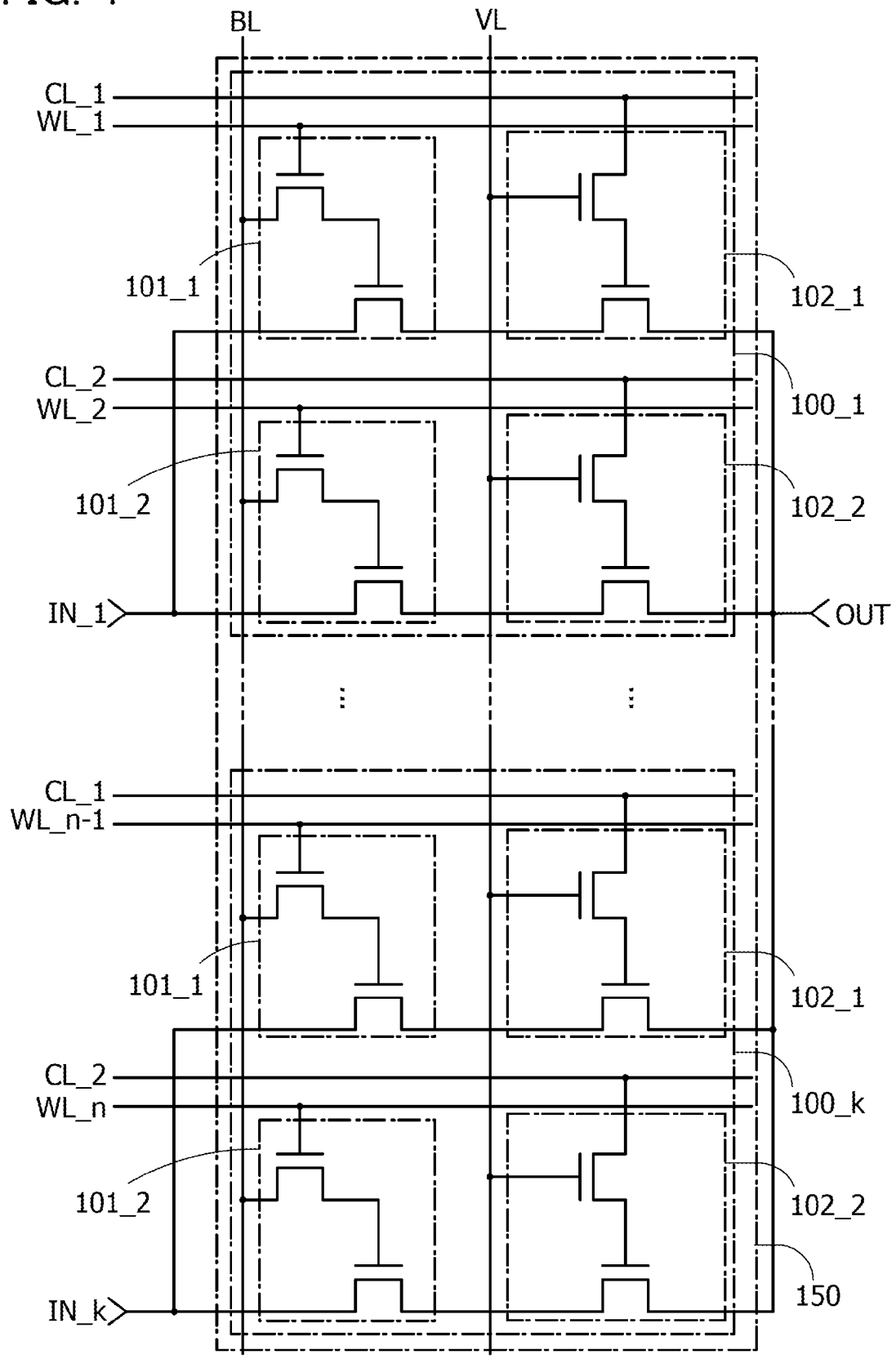
FIG. 4 illustrates a circuit structure of a programmable switch element.

FIG. 4 illustrates a specific structural example of the programmable switch elements 150_1 to 150_3 illustrated in FIG. 2C and FIG. 3. As illustrated in FIG. 4, each programmable switch element 150 includes a plurality of programmable switch elements 100_1 to 100_k. The programmable switch elements 100_1 to 100_k in FIG. 4 each correspond to the programmable switch element 100 in FIG. 1 that has a circuit structure in which a context can be changed by two kinds of context selection signals.

The programmable switch elements 100_1 to 100_k are provided with input terminals IN_1 to IN_k (k is a natural number of 2 or more), respectively. Configuration data stored in the configuration data storage circuit 101_1 or the configuration data storage circuit 1012 is selected in response to two kinds of context selection signals input to the selection line CL_1 and the selection line CL_2, so that a connection between any one of the input terminals IN_1 to IN_k and the output terminal OUT can be switched.

Specifically, in the programmable switch element 150 in FIG. 4, when a context selection signal input to the selection line CL_1 is an H-level potential, switching of a connection between the input terminals IN_1 to IN_k and the output terminal OUT is controlled in accordance with configuration data stored in the configuration data storage circuit 101_1. When a context selection signal input to the selection line CL_2 is an H-level potential, switching of a connection between the input terminals IN_1 to IN_k and the output terminal OUT is controlled in accordance with configuration data stored in the configuration data storage circuit 101_2.

In FIG. 3, the programmable switch element 150_1 controls the connection between the wiring 124_1 and all of the plurality of wirings 133, the plurality of wirings 134, and the plurality of wirings 135. Specifically, the programmable switch element 150_1 has functions of selecting one of the plurality of wirings 133, the plurality of wirings 134, and the plurality of wirings 135 in accordance with configuration data and a context selection signal and connecting the selected wiring to the wiring 124_1.

In the case of using the programmable switch element 150 illustrated in FIG. 4 as the programmable switch element 150_1 illustrated in FIG. 3, the plurality of wirings 133, the plurality of wirings 134, and the plurality of wirings 135 in FIG. 3 correspond to the input terminals IN_1 to IN_k in FIG. 4, and the wiring 124_1 in FIG. 3 corresponds to the output terminal OUT in FIG. 4.

The programmable switch element 150_2 controls the connection between the wiring 1242 and all of the plurality of wirings 133, the plurality of wirings 134, and the plurality of wirings 135. Specifically, the programmable switch element 150_2 has functions of selecting one of the plurality of wirings 133, the plurality of wirings 134, and the plurality of wirings 135 in accordance with configuration data and a context selection signal and connecting the selected wiring to the wiring 124_2.

In the case of using the programmable switch element 150 illustrated in FIG. 4 as the programmable switch element 150_2 illustrated in FIG. 3, the plurality of wirings 133, the plurality of wirings 134, and the plurality of wirings 135 in FIG. 3 correspond to the input terminals IN_1 to IN_k in FIG. 4, and the wiring 1242 in FIG. 3 corresponds to the output terminal OUT in FIG. 4.

The programmable switch element 150_3 controls the connection between the wiring 124_3 and all of the plurality of wirings 133, the plurality of wirings 134, and the plurality of wirings 135. Specifically, the programmable switch element 150_3 has functions of selecting one of the plurality of wirings 133, the plurality of wirings 134, and the plurality of wirings 135 in accordance with configuration data and a context selection signal and connecting the selected wiring to the wiring 124_3.

In the case of using the programmable switch element 100 illustrated in FIG. 1 as the programmable switch element 150_3 illustrated in FIG. 3, the plurality of wirings 133, the plurality of wirings 134, and the plurality of wirings 135 in FIG. 3 correspond to the input terminals IN_1 to IN_k in FIG. 4, and the wiring 124_3 in FIG. 3 corresponds to the output terminal OUT in FIG. 4.

As described above, in one embodiment of the present invention, one of the plurality of wirings such as the wirings 133, the wirings 134, and the wirings 135 connected to the output terminal of the programmable logic element 131 is selected in accordance with configuration data and a context selection signal and the selected wiring is connected to one wiring such as the wiring 124 connected to the input terminal of the programmable logic element 131 by the programmable switch element 150. In the structure in FIG. 2A, the switch circuit 110 including the programmable switch element 150 with the above structure and the above various wirings connection of which is controlled by the switch circuit 110 are provided between the columns including the programmable logic elements 131, such as the first column 140_1, the second column 140_2, and the third column 140_3, whereby a connection between one of the programmable logic elements 131 in the second column 140_2 and another one of the programmable logic elements 131 in the second column 140_2 can be controlled by one of the programmable switch elements 150. Further, a connection between one of the programmable logic elements 131 in the first column 140_1 and one of the programmable logic elements 131 in the second column 140_2 can be controlled by one of the programmable switch elements 150. Furthermore, a connection between one of the programmable logic elements 131 in the second column 140_2 and one of the programmable logic elements 131 in the third column 140_3 can be controlled by one of the programmable switch elements 150. Accordingly, the structure in FIG. 2A enables the PLD 130 including a small number of switches in a routing resource while having high design flexibility.

<Structural Example of PLE>

Figure 5A:
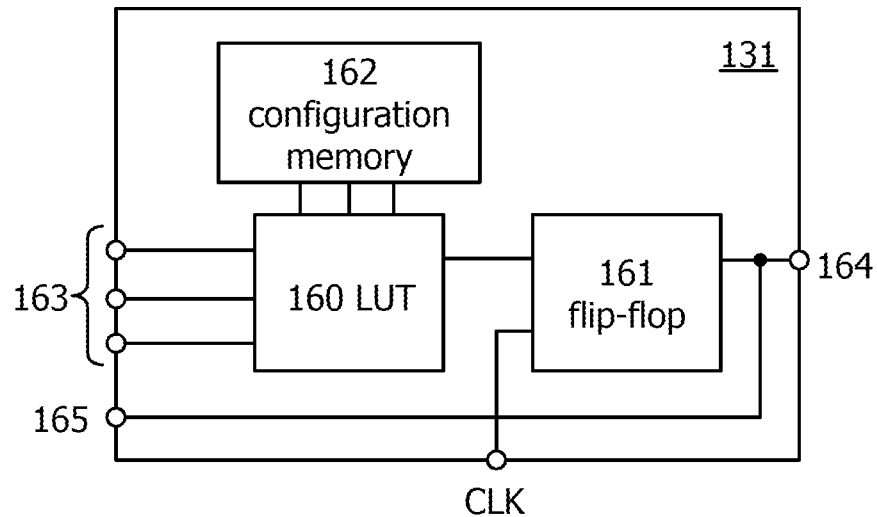
FIGS. 5A and 5B illustrate structures of programmable switch elements.

FIG. 5A illustrates the programmable logic element 131 of one embodiment. The programmable logic element 131 illustrated in FIG. 5A includes a look-up table (LUT) 160, a flip-flop 161, and a configuration memory 162. The configuration memory 162 has functions of storing configuration data transmitted from a memory element and outputting the configuration data selected in response to a context selection signal. A logic circuit determined by the LUT 160 depends on the contents of configuration data transmitted from the configuration memory 162. When the configuration data is determined, one output value of the LUT 160 with respect to input values of a plurality of input signals applied to input terminals 163 is determined. Then, the LUT 160 outputs a signal containing the output value. The flip-flop 161 holds the signal output from the LUT 160 and outputs an output signal corresponding to the signal from a first output terminal 164 and a second output terminal 165 in synchronization with a clock signal CLK.

The type of the flip-flop 161 may be determined by configuration data. Specifically, the flip-flop 161 may have a function of any of a D flip-flop, a T flip-flop, a JK flip-flop, and an RS flip-flop in accordance with the configuration data.

Figure 5B:
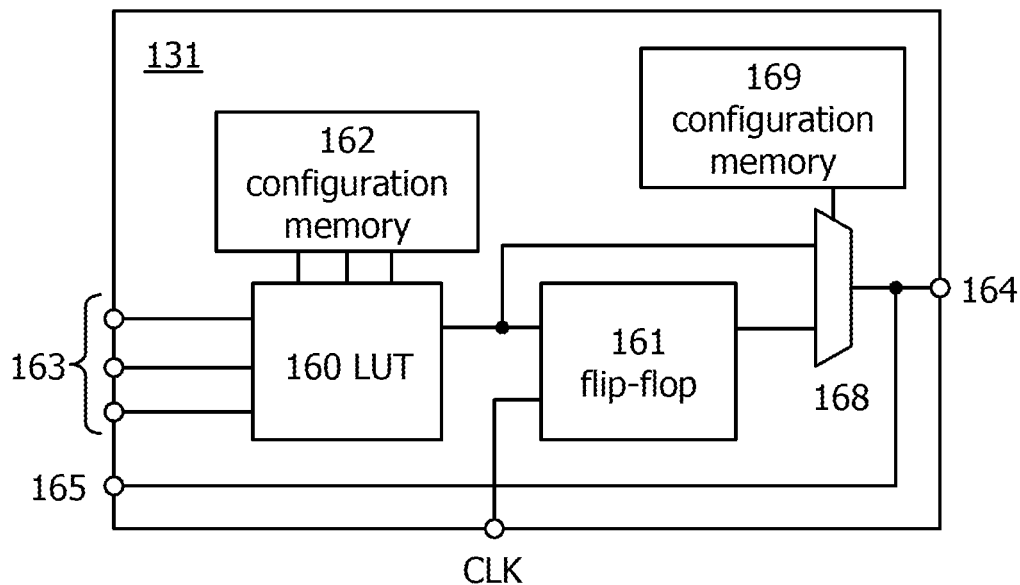

FIG. 5B illustrates the programmable logic element 131 of another embodiment. The programmable logic element 131 in FIG. 5B includes a multiplexer 168 and a configuration memory 169 in addition to the components of the programmable logic element 131 in FIG. 5A. In FIG. 5B, an output signal from the LUT 160 and an output signal from the flip-flop 161 are input to the multiplexer 168. The multiplexer 168 has functions of selecting and outputting one of the two output signals in accordance with configuration data stored in the configuration memory 169 and a context selection signal. The output signal of the multiplexer 168 is output from the first output terminal 164 and the second output terminal 165.

<Structural Example of LUT>

Next, a structural example of the LUT 160 included in the programmable logic element 131 will be described. The LUT 160 can be formed using a plurality of multiplexers. Configuration data can be input to any of input terminals and control terminals of the plurality of multiplexers.

Figure 6A:
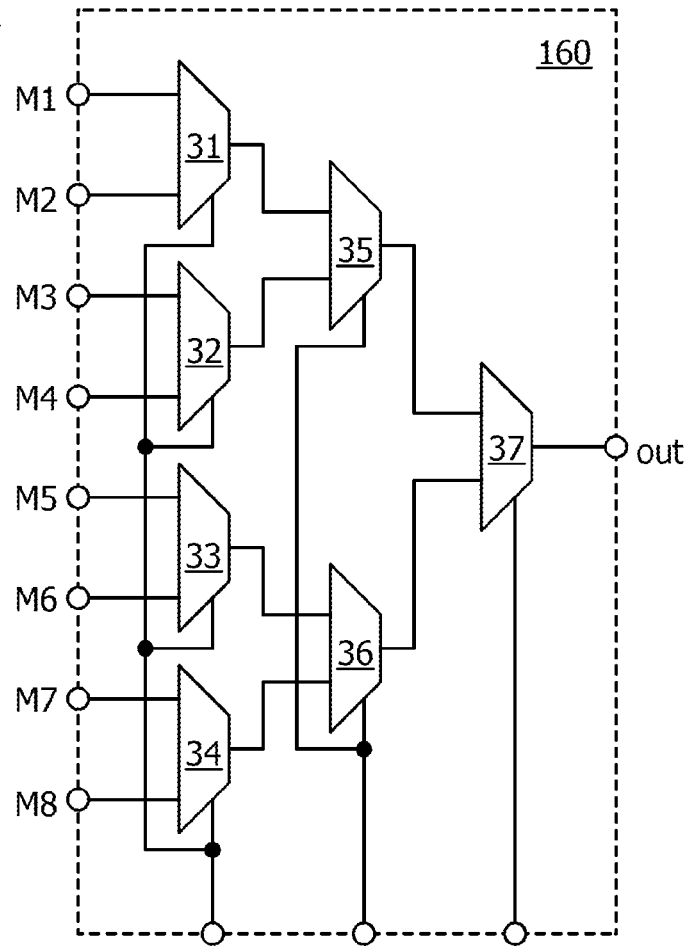
FIGS. 6A to 6C illustrate structures of LUTs.

FIG. 6A illustrates the LUT 160 of one embodiment included in the programmable logic element 131.

In FIG. 6A, the LUT 160 includes seven two-input multiplexers (multiplexers 31 to 37). Input terminals of the multiplexers 31 to 34 correspond to input terminals M1 to M8 of the LUT 160.

Control terminals of the multiplexers 31 to 34 are electrically connected to each other and correspond to an input terminal in3 of the LUT 160. Output terminals of the multiplexers 31 and 32 are connected to two input terminals of the multiplexer 35. Output terminals of the multiplexers 33 and 34 are electrically connected to two input terminals of the multiplexer 36. Control terminals of the multiplexers 35 and 36 are electrically connected to each other and correspond to an input terminal in2 of the LUT 160. Output terminals of the multiplexers 35 and 36 are electrically connected to two input terminals of the multiplexer 37. A control terminal of the multiplexer 37 corresponds to an input terminal in1 of the LUT 160. An output terminal out of the multiplexer 37 corresponds to an output terminal OUT of the LUT 160.

The kind of logic operation performed by the LUT 160 can be determined in such a manner that output signals corresponding to configuration data stored in a configuration memory are input from the configuration memory to the input terminals M1 to M8.

Figure 6B:
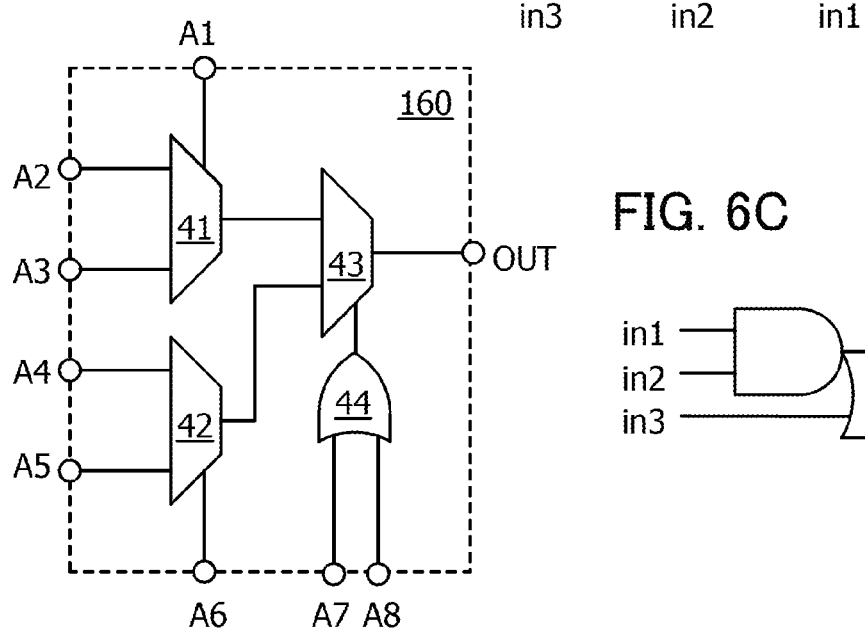
Figure 6C:

For example, when output signals corresponding to configuration data that are stored in the configuration memory and have digital values "0", "1", "0", "1", "0", "1", "1", and "1" are input from the configuration memory to the input terminals M1 to M8 of the LUT 160 in FIG. 6A, respectively, the function of an equivalent circuit illustrated in FIG. 6C can be obtained.

FIG. 6B illustrates the LUT 160 of another embodiment included in the programmable logic element 131.

In FIG. 6B, the LUT 160 is composed of three two-input multiplexers (multiplexers 41 to 43) and a two-input OR circuit 44.

Output terminals of the multiplexers 41 and 42 are connected to two respective input terminals of the multiplexer 43. An output terminal of the OR circuit 44 is connected to a control terminal of the multiplexer 43. An output terminal of the multiplexer 43 corresponds to the output terminal OUT of the LUT 160.

The kind of logic operation performed by the LUT 160 can be determined when an output signal corresponding to configuration data stored in a configuration memory is input from the configuration memory to any of a control terminal A1 and input terminals A2 and A3 of the multiplexer 41, a control terminal A6 and input terminals A4 and A5 of the multiplexer 42, and input terminals A7 and A8 of the OR circuit 44.

For example, when output signals corresponding to configuration data that are stored in the configuration memory and have digital values "0", "1", "0", "0", and "0" are input from the configuration memory to the input terminal A2, the input terminal A4, the input terminal A5, the control terminal A6, and the input terminal A8 of the LUT 160 in FIG. 6B, the function of the equivalent circuit illustrated in FIG. 6C can be obtained. In the above structure, the control terminal A1, the input terminal A3, and the input terminal A7 correspond to the input terminal in1, the input terminal in2, and the input terminal in3, respectively.

Note that FIGS. 6A and 6B illustrate examples of the LUT 160 including two-input multiplexers; alternatively, the LUT 160 may include multiplexers with three or more inputs.

The LUT 160 may further include any or all of a diode, a resistor, a logic circuit (or a logic element), and a switch in addition to the multiplexers. As the logic circuit (or the logic element), a buffer, an inverter, a NAND circuit, a NOR circuit, a three-state buffer, a clocked inverter, or the like can be used. The switch may be, for example, an analog switch or a transistor.

The case illustrated in FIG. 6C in which three-input one-output logic operation is performed with the LUT 160 in FIG. 6A or FIG. 6B is described here; however, one embodiment of the present invention is not limited thereto. By appropriately selecting the structure of the LUT 160 and configuration data to be input, logic operation with four or more inputs and two or more outputs can be performed.

As described above, by being combined with Embodiment 1, one embodiment of the present invention can provide a circuit structure in which a gate of a transistor provided between an input terminal and an output terminal of a programmable switch element is in an electrically floating state in a period when a signal is input to the programmable switch element. This structure enables a signal that is applied to a programmable logic element to control the voltage of the gate so that it is boosted by a boosting effect. This can suppress a reduction in amplitude voltage.

This embodiment can be implemented in combination with any of the other embodiments as appropriate.

(Embodiment 3)

In this embodiment, specific operations in the circuit structure described in Embodiment 1 will be described.

Figure 7A:
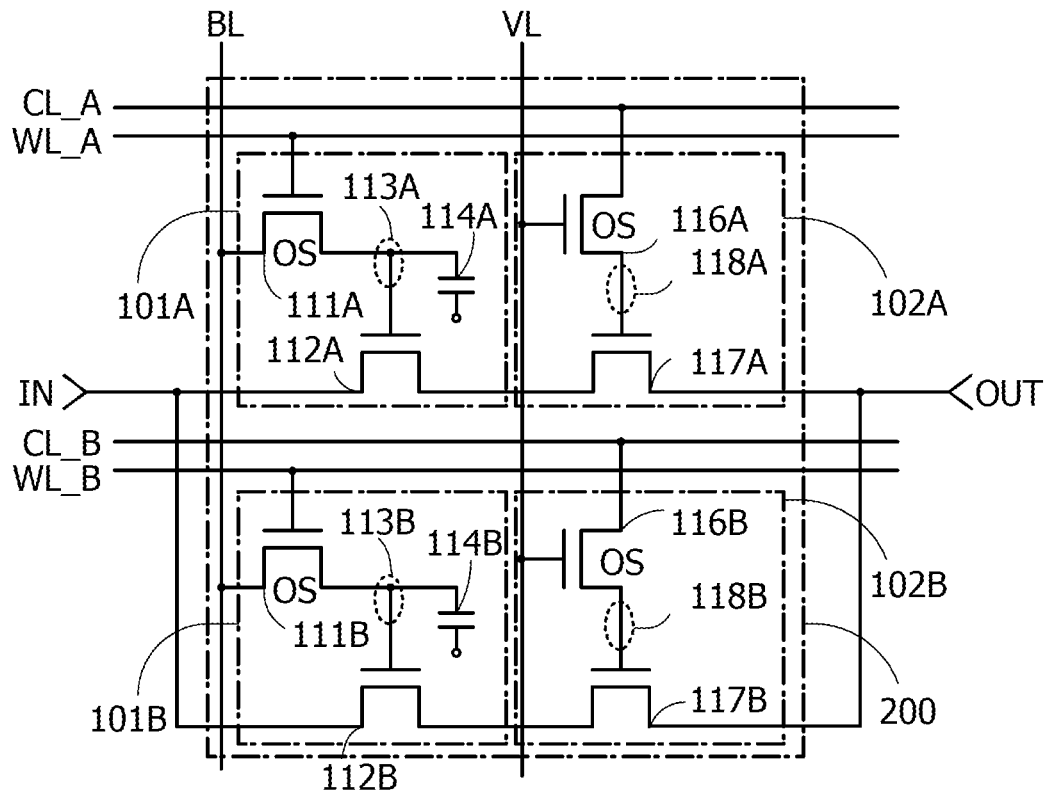
FIGS. 7A and 7B illustrate circuit structures of programmable switch elements.

First, FIG. 7A illustrates a circuit structure example where connection between programmable logic elements is changed in such a manner that two configuration data are stored in the programmable switch element with the circuit structure illustrated in FIG. 1 and the configuration data are selected by a context selection signal.

A programmable switch element 200 illustrated in FIG. 7A includes configuration data storage circuits 101A and 101B and context selection circuits 102A and 102B.

The configuration data storage circuit 101A includes a transistor 111A, a transistor 112A, a node 113A, and a capacitor 114A. The configuration data storage circuit 101B includes a transistor 111B, a transistor 112B, a node 113B, and a capacitor 114B.

The context selection circuit 102A includes a transistor 116A, a transistor 117A, and a node 118A. The context selection circuit 102B includes a transistor 116B, a transistor 117B, and a node 118B.

In FIG. 7A, "OS" is written beside the transistor 111A, the transistor 111B, the transistor 116A, and the transistor 116B in order to indicate that the transistors each include an oxide semiconductor layer.

A word line WL_A is connected to a gate of the transistor 111A. A selection line CL_A is connected to one of a source and a drain of the transistor 116A. A word line WL_B is connected to a gate of the transistor 111B. A selection line CL_B is connected to one of a source and a drain of the transistor 116B. A bit line BL is connected to one of a source and a drain of the transistor 111A and one of a source and a drain of the transistor 111B. A power supply line VL is connected to gates of the transistor 116A and the transistor 116B.

For the transistor 111A and the transistor 111B, the descriptions of the transistors 111_1 to 111_m illustrated in FIG. 1 can be referred to. For the transistor 112A and the transistor 112B, the descriptions of the transistors 112_1 to 112_m illustrated in FIG. 1 can be referred to. A circuit including the node 113A, the capacitor 114A, the node 113B, and the capacitor 114B corresponds to a circuit including the nodes 113_1 to 113_m illustrated in FIG. 1, and for the nodes and the capacitor, the descriptions of the nodes 113_1 to 113_m can be referred to.

For the transistor 116A and the transistor 116B, the descriptions of the transistor 116_1 to 116_m illustrated in FIG. 1 can be referred to. For the transistor 117A and the transistor 117B, the descriptions of the transistor 117_1 to 117_m illustrated in FIG. 1 can be referred to. For the node 118A and the node 118B, the descriptions of the nodes 118_1 to 118_m illustrated in FIG. 1 can be referred to.

For the word line WL_A and the word line WL_B, the descriptions of the word lines WL_1 to WL_m illustrated in FIG. 1 can be referred to. A word signal to control the conduction state of the transistor 116A is input to the word line WL_A, and a word signal to control the conduction state of the transistor 116B is input to the word line WL_B.

For the selection line CL_A and the selection line CL_B, the descriptions of the selection lines CL_1 to CL_m illustrated in FIG. 1 can be referred to. A context selection signal to be written to the node 118A is input to the selection line CL_A, and a context selection signal to be written to the node 118B is input to the selection line CL_B.

For the bit line BL, the description of the bit line BL illustrated in FIG. 1 can be referred to. To the bit line BL illustrated in FIG. 7A, configuration data to be stored in the node 113A and the capacitor 114A and configuration data to be stored in the node 113B and the capacitor 114B are input.

For the power supply line VL, the description of the power supply line VL illustrated in FIG. 1 can be referred to.

Figure 7B:
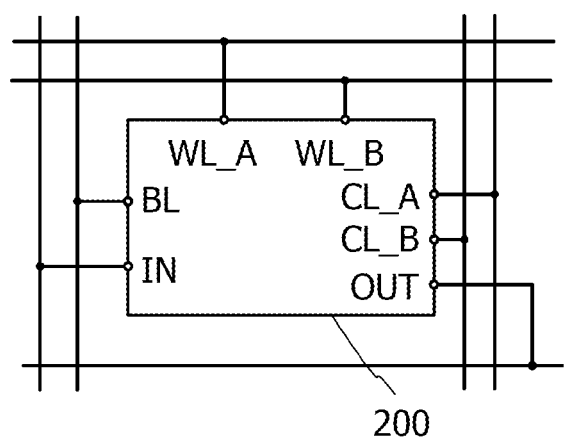
Figure 8:
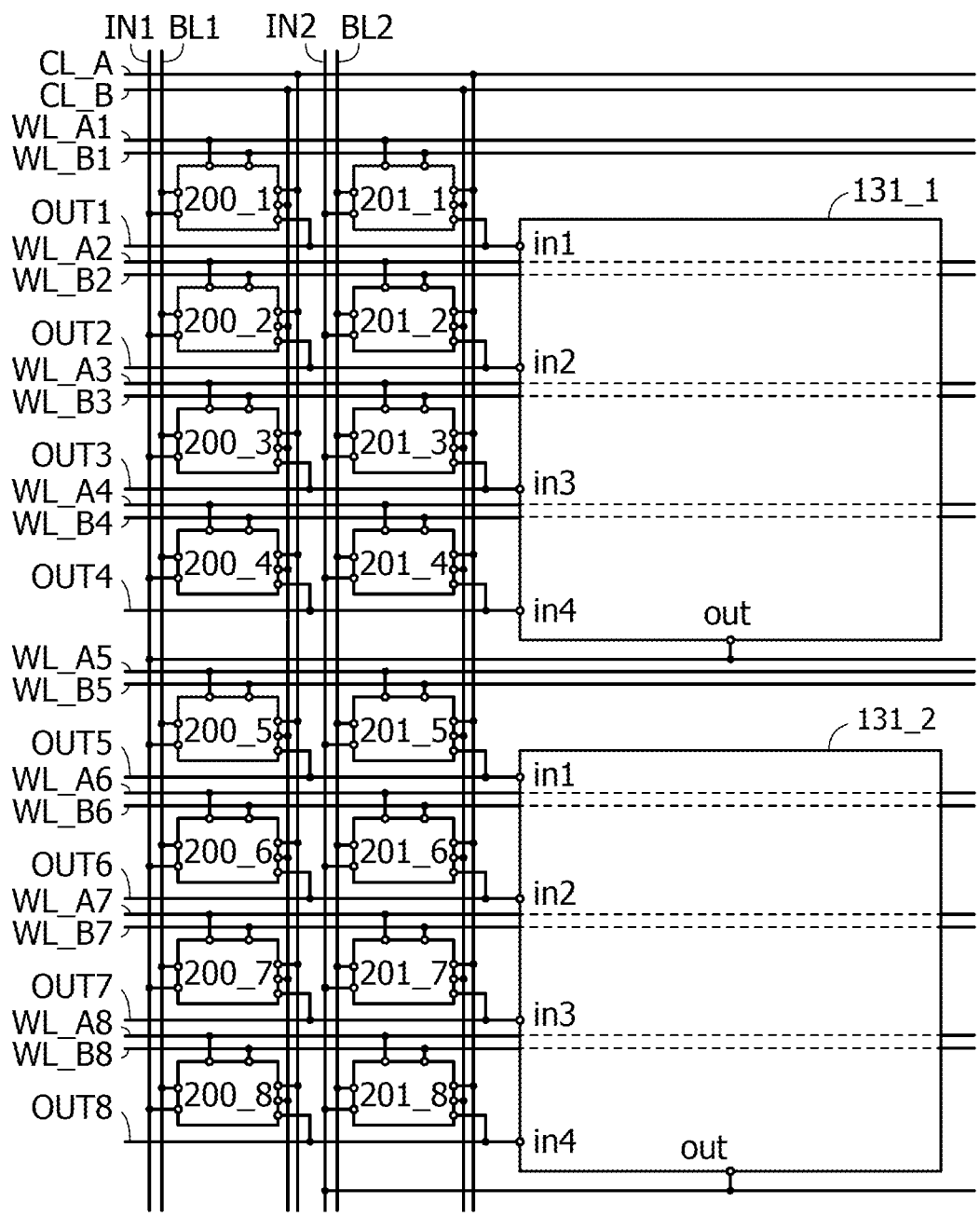
FIG. 8 illustrates a circuit structure of a programmable logic element and a programmable switch element.

A block diagram of a circuit in FIG. 7B illustrates a brief circuit structure of the programmable switch element 200 in FIG. 7A. In the block diagram illustrated in FIG. 7B, reference numerals are written to show connection relation with peripheral wirings extracted from FIG. 7A; the wirings connected to terminals corresponding to the reference numerals are connected to the element illustrated in FIG. 7A. FIG. 8 will be described using the circuit block illustrated in FIG. 7B. The power supply line VL connected to each programmable switch element is not illustrated.

FIG. 8 illustrates programmable switch elements 200_1 to 200_8, programmable switch elements 201_1 to 2018, and circuit blocks of the programmable logic elements 131_1 and 1312.

Word lines WL_A1 to WL_A8, word lines WL_B1 to WL_B8, bit lines BL1 and BL2, input terminals IN1 and IN2, output terminals OUT1 to OUT8, and the selection lines CL_A and CL_B are connected to the programmable switch elements 200_1 to 200_8 and the programmable switch elements 2011 to 2018 as illustrated in FIG. 8.

The programmable logic elements 131_1 and 131_2 each have input terminals in1 to in4 and an output terminal out, and are connected to the programmable switch elements 200_1 to 200_8 and the programmable switch elements 201_1 to 201_8 as illustrated in FIG. 8.

Figure 9:
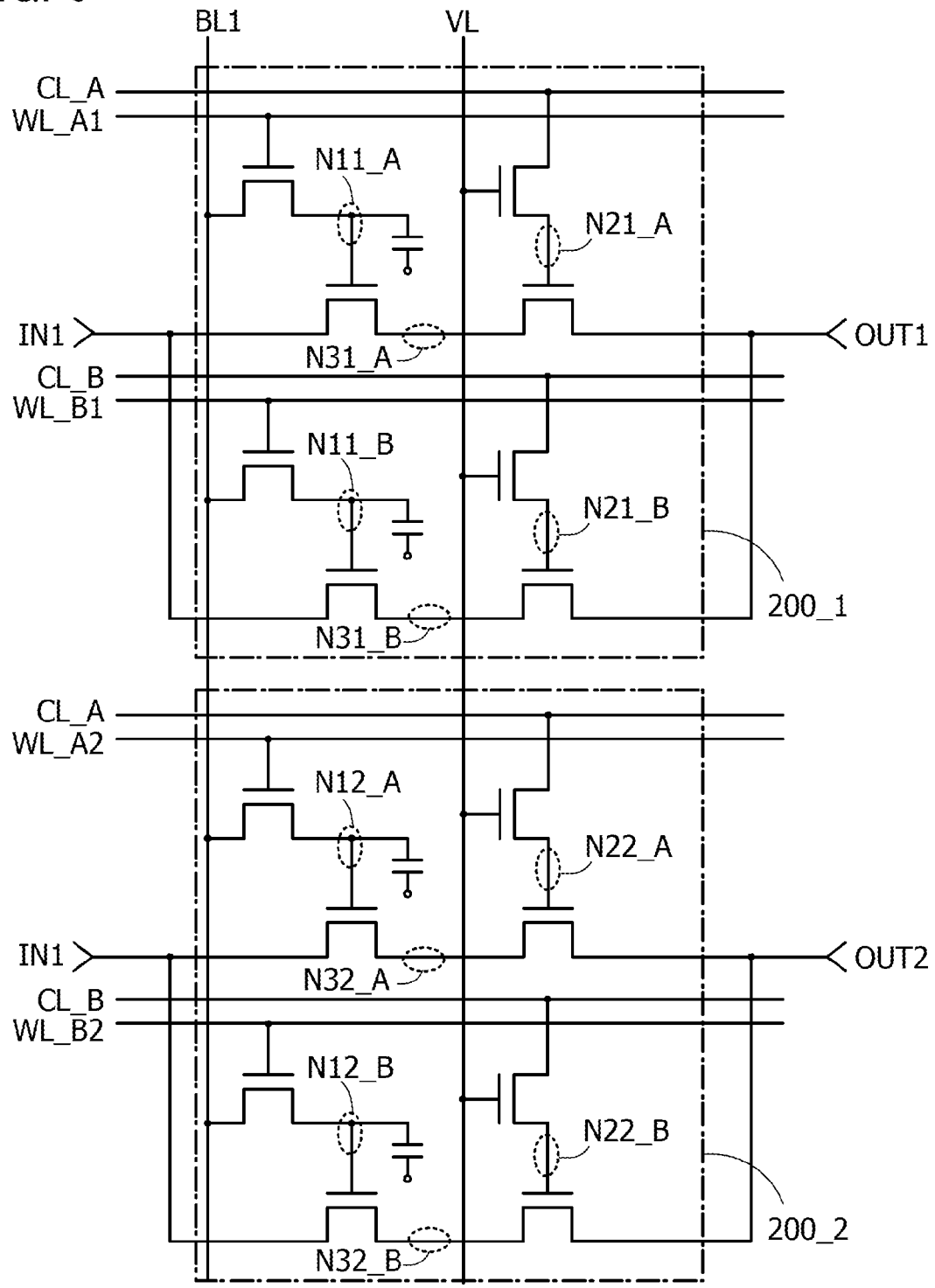
FIG. 9 illustrates a circuit structure of a programmable switch element.
Figure 10:
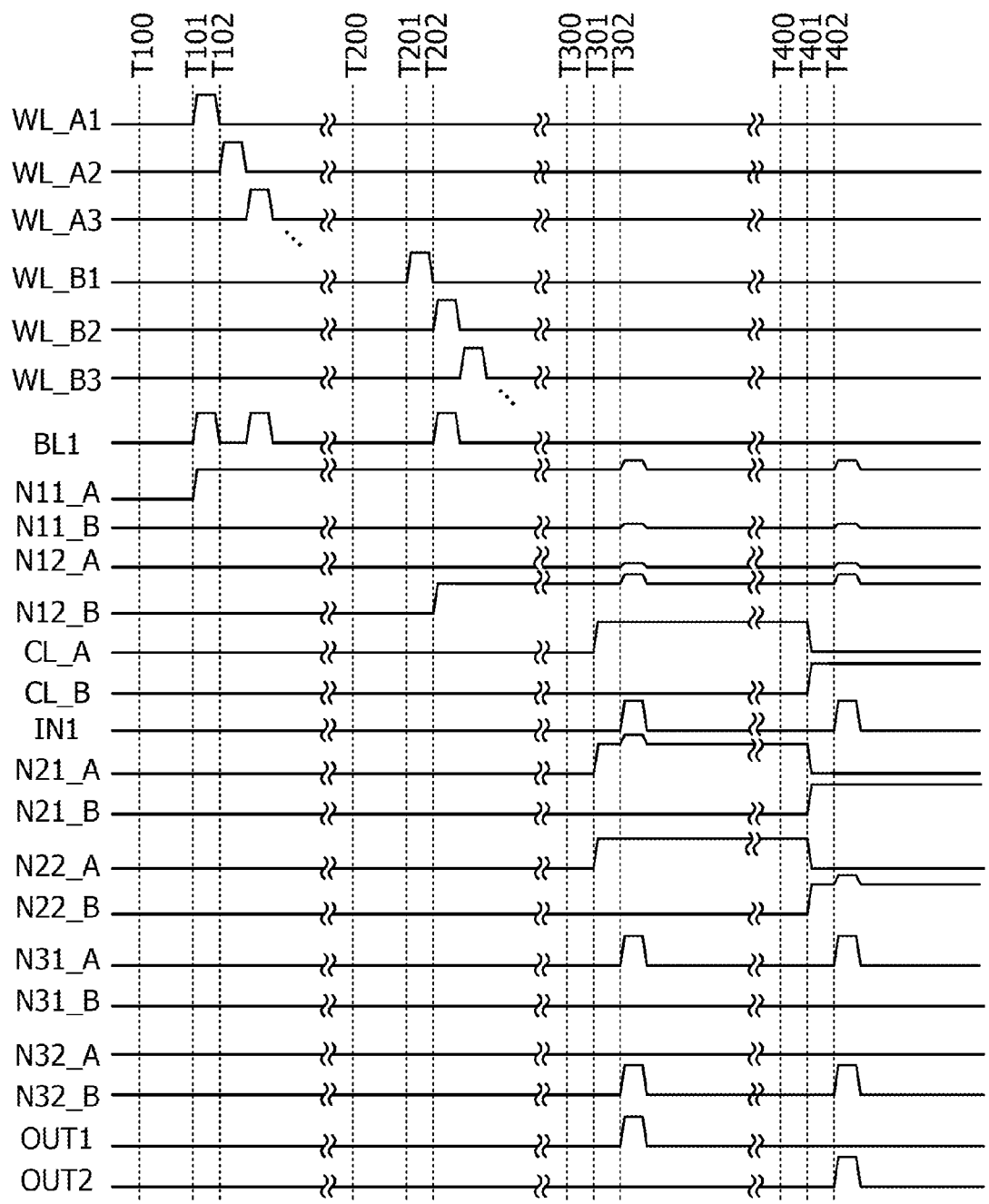
FIG. 10 is a timing chart of a programmable switch element.

Next, FIG. 9 illustrates nodes and wirings in the programmable switch element 200_1 and the programmable switch element 200_2 that are used in a timing chart of the circuit structure in FIG. 8, which is shown in FIG. 10.

For example, in the timing chart shown in FIG. 10, a node in the programmable switch element 200_1 in FIG. 9 that corresponds to the node 113A in FIG. 7A is referred to as a node N11_A. A node in the programmable switch element 200_1 in FIG. 9 that corresponds to the node 118A in FIG. 7A is referred to as a node N21_A. A node in the programmable switch element 200_1 in FIG. 9 that is between the transistor 112A and the transistor 117A in FIG. 7A is referred to as a node N31_A.

In the timing chart shown in FIG. 10, a node in the programmable switch element 200_1 in FIG. 9 that corresponds to the node 113B in FIG. 7A is referred to as a node N11_B. A node in the programmable switch element 200_1 in FIG. 9 that corresponds to the node 118B in FIG. 7A is referred to as a node N21_B. A node in the programmable switch element 200_1 in FIG. 9 that is between the transistor 112B and the transistor 117B in FIG. 7A is referred to as a node N31_B.

In the timing chart shown in FIG. 10, a node in the programmable switch element 200_2 in FIG. 9 that corresponds to the node 113A in FIG. 7A is referred to as a node N12_A. A node in the programmable switch element 200_2 in FIG. 9 that corresponds to the node 118A in FIG. 7A is referred to as a node N22_A. A node in the programmable switch element 200_2 in FIG. 9 that is between the transistor 112A and the transistor 117A in FIG. 7A is referred to as a node N32_A.

In the timing chart shown in FIG. 10, a node in the programmable switch element 2002 in FIG. 9 that corresponds to the node 113B in FIG. 7A is referred to as a node N12_B. A node in the programmable switch element 200_1 in FIG. 9 that corresponds to the node 118B in FIG. 7A is referred to as a node N22_B. A node in the programmable switch element 200_2 in FIG. 9 that is between the transistor 112B and the transistor 117B in FIG. 7A is referred to as a node N32_B.

FIG. 10 shows a timing chart of the circuit diagrams illustrated in FIGS. 8 and 9.

In FIG. 10, first, configuration of a first context is started at a time T100.

Specifically, at a time T101, the word line WL_A1 becomes at an H-level potential and the potential of the bit line BL is written to the node N11_A. Then, at a time T102, the word line WL_A2 becomes at an H-level potential and the potential of the bit line BL is written to the node N12_A. After the writing is completed, each word line becomes at an L-level potential, so that the node N11_A and the node N12_A become in an electrically floating state.

Next, configuration of a second context is started at a time T200.

Specifically, at a time T201, the word line WL_B1 becomes at an H-level potential and the potential of the bit line BL is written to the node N11_B. Then, at a time T202, the word line WL_B2 becomes at an H-level potential and the potential of the bit line BL is written to the node N12_B. After the writing is completed, each word line becomes at an L-level potential, so that the node N11_B and the node N12_B become in an electrically floating state.

Through the above operations, the configurations of the first context and the second context are completed.

Next, from a time T300, the first context is selected by a user.

Specifically, when the first context is selected by the user at a time T301, the selection line CL_A and the selection line CL_B are set at an H-level potential and an L-level potential, respectively. As a result, the node N21_A and the node N22_A each become at an H-level potential and in an electrically floating state. The node N21_B and the node N22_B each become at an L-level potential.

When an H-level potential is input to the input terminal IN1 at a time T302, the voltage of the node N11_A that is in an electrically floating state is boosted by a boosting effect. Thus, the potential of the node N31_A is not decreased by the threshold voltage of the transistor 112A but is increased. Since the potential of the node N31_A is increased, the voltage of the node N21_A that is in an electrically floating state is boosted by a boosting effect. Thus, the potential of the output terminal OUT1 is not decreased by the threshold voltage of the transistor 117A but becomes an H-level potential.

Further, when an H-level potential is input to the input terminal IN1 at the time T302, the voltages of the node N11_B and the node N12_A that are in an electrically floating state are boosted by a boosting effect. However, when the node N11_B and the node N12_A are each at an L-level potential, a boosting effect is not so significant as that when the node N11_B and the node N12_A are each at an H-level potential; thus, the voltages of the node N11_B and the node N12_A are hardly boosted. For this reason, the node N31_B and the node N32_A each remain at an L-level potential.

Further, when an H-level potential is input to the input terminal IN1 at the time T302, the voltage of the node N12_B that is in an electrically floating state is boosted by a boosting effect. Accordingly, the node N32_B becomes at an H-level potential. However, since the node N22_B is at an L-level potential, the output terminal OUT2 remains at an L-level potential.

Next, from a time T400, the second context is selected by a user.

Specifically, when the second context is selected by the user at a time T401, the selection line CL_A and the selection line CL_B are set at an L-level potential and an H-level potential, respectively. As a result, the node N21_B and the node N22_B each become at an H-level potential and in an electrically floating state. The node N21_A and the node N22_A each become at an L-level potential.

When an H-level potential is input to the input terminal IN1 at a time T402, the voltage of the node N12_B that is in an electrically floating state is boosted by a boosting effect. Thus, the potential of the node N32_B is not decreased by the threshold voltage of the transistor 112B but is increased. Since the potential of the node N32_B is increased, the voltage of the node N22_B that is in an electrically floating state is boosted by a boosting effect. Thus, the potential of the output terminal OUT2 is not decreased by the threshold voltage of the transistor 117B but becomes an H-level potential.

Further, when an H-level potential is input to the input terminal IN1 at the time T402, the voltages of the node N11_B and the node N12_A that are in an electrically floating state are boosted by a boosting effect. However, when the node Ni1_B and the node N12_A are each at an L-level potential, a boosting effect is not so significant as that when the node N11_B and the node N12_A are each at an H-level potential; thus, the voltages of the node N11_B and the node N12_A are hardly boosted. For this reason, the node N31_B and the node N32_A each remain at an L-level potential.

Further, when an H-level potential is input to the input terminal IN1 at the time T402, the voltage of the node N11_A that is in an electrically floating state is boosted by a boosting effect. Accordingly, the node N31_A becomes at an H-level potential. However, since the node N21_A is at an L-level potential, the output terminal OUT1 remains at an L-level potential.

This embodiment can be implemented in combination with any of the other embodiments as appropriate.

(Embodiment 4)

In this embodiment, descriptions will be given of verification results obtained by circuit calculation of a boosting effect in the structures of programmable switch elements included in PLDs of one embodiment of the present invention and comparative examples.

For the circuit calculation, an analog circuit simulator "SmartSpice" produced by Silvaco, Inc. was used, and waveforms of signals transmitted between an input terminal and an output terminal of programmable switch elements with different circuit structures were compared and evaluated.

Figure 11A:
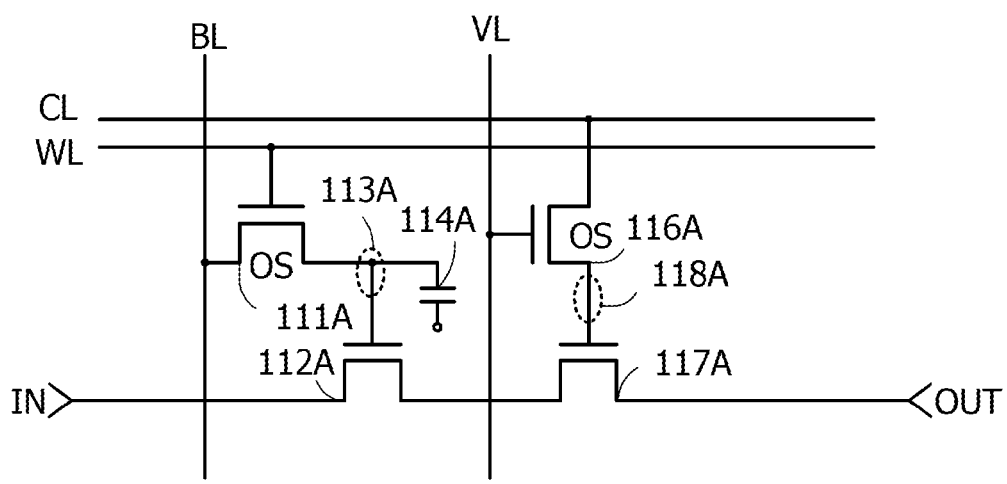
FIGS. 11A and 11B illustrate operation of a programmable switch element.
Figure 12A:
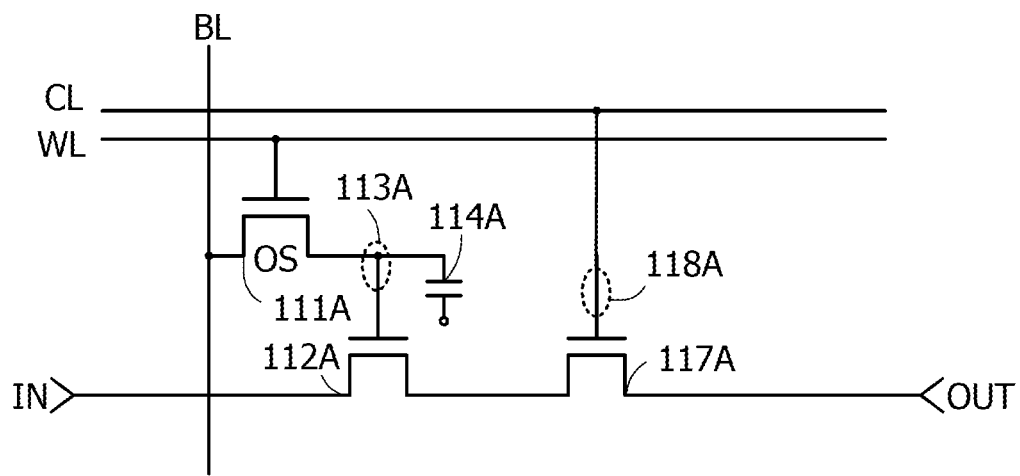
FIGS. 12A and 12B illustrate operation of a programmable switch element.
Figure 13A:
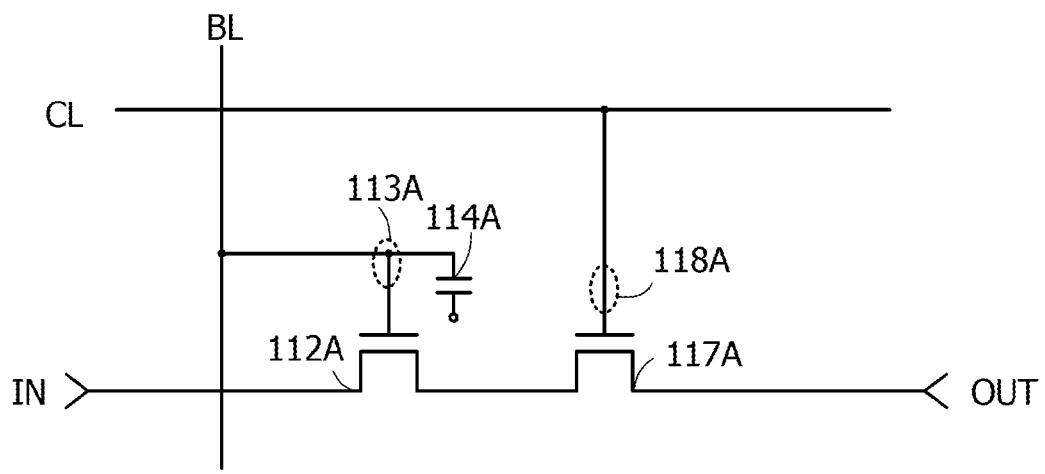
FIGS. 13A and 13B illustrate operation of a programmable switch element.

The circuit structure in FIG. 11A was compared with the circuit structures in FIG. 12A and FIG. 13A. The circuit structure in FIG. 11A corresponds to part of the circuit structure in FIG. 7A described in the above embodiment.

The circuit structure illustrated in FIG. 12A, which is a comparative example, is different from the circuit structure in FIG. 7A in that the transistor 116A is not provided. The circuit structure illustrated in FIG. 13A is different from the circuit structure in FIG. 7A in that the transistor 111A, the transistor 116A, and the word line WL are not provided.

Figure 11B:
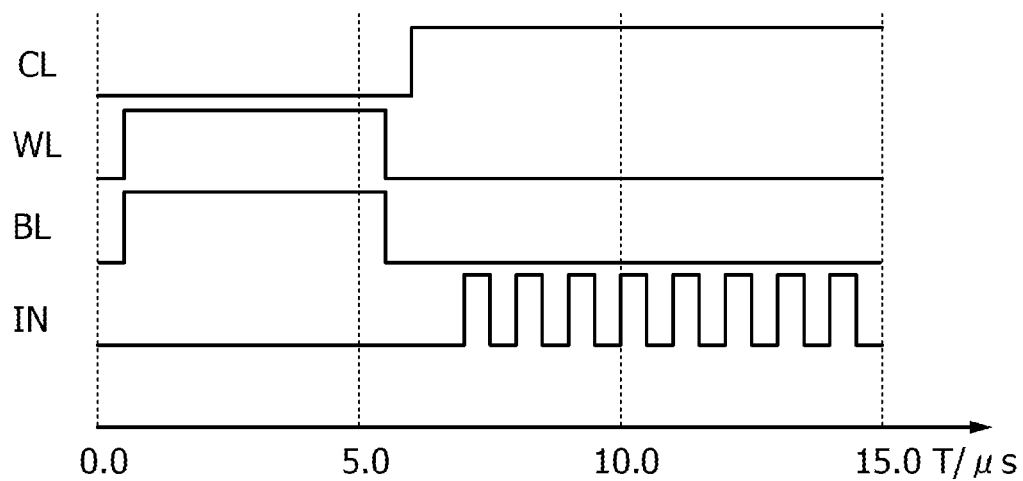
Figure 12B:
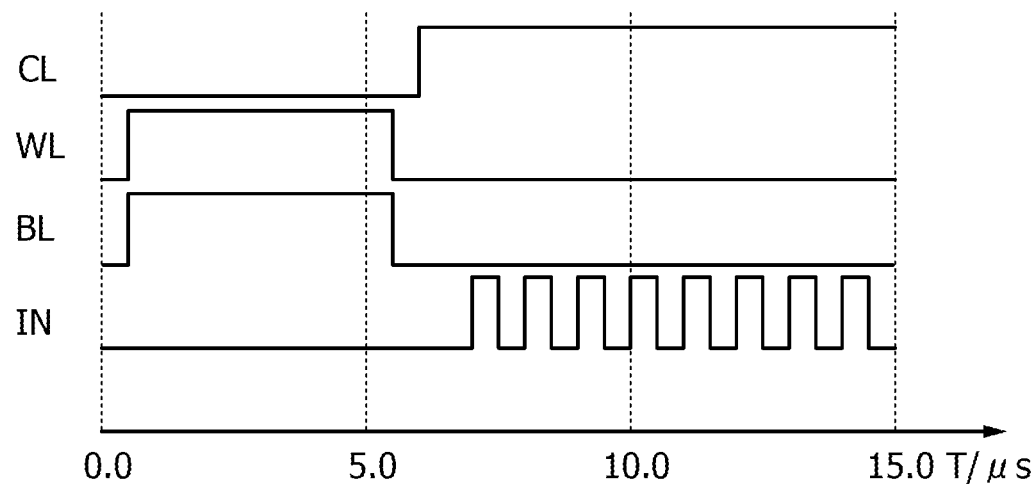
Figure 13B:
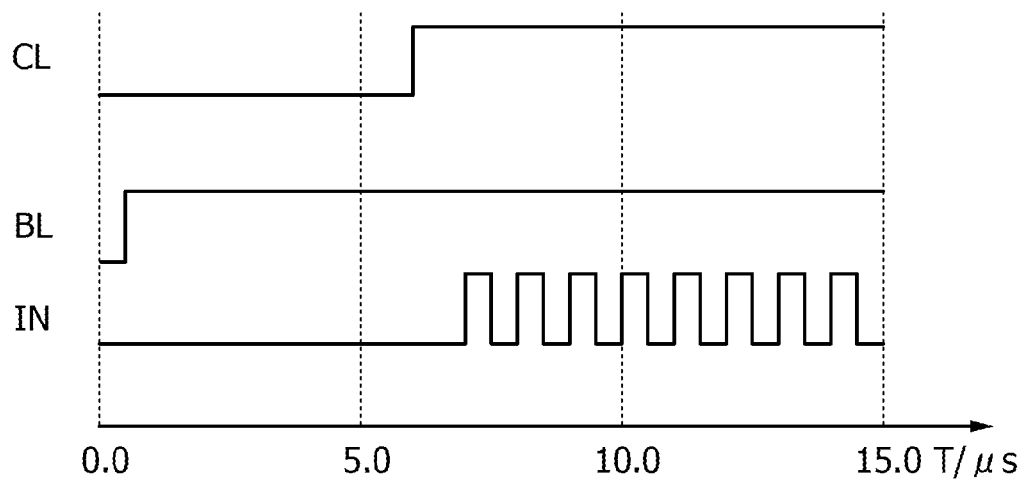

FIG. 11B, FIG. 12B, and FIG. 13B show timing charts of signals input to a word line WL, a selection line CL, a bit line BL, and an input terminal IN in FIG. 11A, FIG. 12A, and FIG. 13A.

In FIG. 11B, FIG. 12B, and FIG. 13B, the signal input to the input terminal IN is a square wave signal with a frequency of 1 MHz.

In FIG. 11A and FIG. 12A, "OS" is written beside the transistor 111A and the transistor 116A in order to indicate that they are transistors each including an oxide semiconductor layer (hereinafter abbreviated to OS transistors). The transistor 112A and the transistor 117A in FIG. 11A, FIG. 12A, and FIG. 13A are transistors each including a silicon semiconductor layer (hereinafter abbreviated to Si transistors).

Parameters used in circuit calculation of the circuit structures illustrated in FIG. 11A, FIG. 12A, and FIG. 13A are given below.

Application voltage conditions for circuit calculation are as follows: an H-level potential is 2.5 V; and an L-level potential is 0 V. The size of the Si transistor is as follows: the channel length L is 0.5 µm; and the channel width W is 15 µm. The size of the OS transistor is as follows: the channel length L is 1 µm; and the channel width W is 4 µm. Characteristics parameters of the Si transistor and the OS transistor used for circuit calculation are values extracted from an actual device. The capacitance of the capacitor 114A is 4 fF.

Next, operations for circuit calculation shown in FIG. 11B, FIG. 12B, and FIG. 13B will be described.

First, the initial values of the potentials of signals supplied to wirings and the electric charge in nodes in the circuit structures illustrated in FIG. 11A, FIG. 12A, and FIG. 13A were L-level potentials, assuming that a power supply voltage was not yet applied.

Then, an H-level potential was supplied to a power supply line VL in the circuit structure illustrated in FIG. 11A.

Next, the potential supplied to the word line WL was switched from an L level to an H level in the circuit structures illustrated in FIG. 11A and FIG. 12A on the assumption of a configuration operation. Concurrently with the switching of the potential of the word line WL, a potential supplied to the bit line BL was switched from an L level to an H level. Thus, an H-level potential was stored in the node 113A in the circuit structures illustrated in FIG. 11A and FIG. 12A. After that, the potentials supplied to the word line WL and the bit line BL were switched from an H level to an L level to complete the configuration.

Next, the potential of the selection line CL was switched from an L level to an H level in the circuit structures illustrated in FIG. 11A, FIG. 12A, and FIG. 13A on the assumption of selection of a context. In FIG. 11A, the transistor 116A was turned on, whereby an H-level potential was written to the node 118A. In FIG. 12A and FIG. 13A, an H-level potential was directly written to the node 118A. After that, the potential of the selection line CL was maintained at an H level and the potential of the node 118A was increased to an H level, so that the transistor 116A was turned off.

Then, a square wave signal was input to the input terminal, whereby in the circuit structures illustrated in FIG. 11A, FIG. 12A, and FIG. 13A, a square wave signal was output from the output terminal OUT because the transistors 112A and 117A are in an on state.

Figure 14:
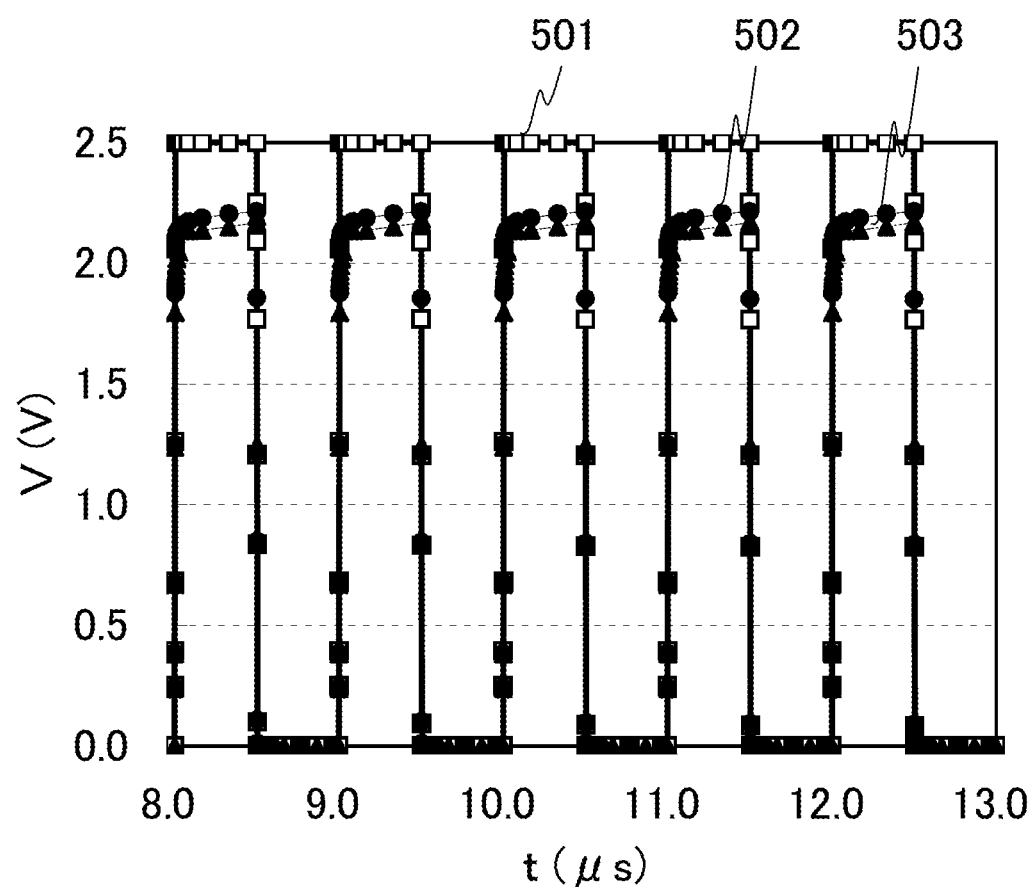
FIG. 14 shows signal waveforms of a programmable switch element.

In FIG. 14, results of the circuit calculation are shown, where the horizontal axis represents time and the vertical axis represents voltage of a signal output from the output terminal FIG. 14 shows a waveform of a signal 501 (square dots) output from the output terminal OUT in FIG. 11A, a waveform of a signal 502 (circle dots) output from the output terminal OUT in FIG. 12A, and a waveform of a signal 503 (triangle dots) output from the output terminal OUT in FIG. 13A. The rounded waveforms of the signals output from the output terminals in the circuit structures indicate an influence of a boosting effect.

As a result of circuit calculation, FIG. 14 shows that there was almost no attenuation in signal waveforms in the circuit structure in FIG. 11A corresponding to one embodiment of the present invention, whereas there was attenuation in signal waveforms in the circuit structures in FIG. 12A and FIG. 13A.

This embodiment can be implemented in combination with any of the other embodiments as appropriate.

(Embodiment 5)

In this embodiment, an oxide semiconductor that can be used for the semiconductor layer in the transistor with a low off-state current described in the above embodiment will be described.

An oxide semiconductor used for a channel formation region in the semiconductor layer of the transistor preferably contains at least indium (In) or zinc (Zn). In particular, the oxide semiconductor preferably contains both In and Zn. The oxide semiconductor preferably contains a stabilizer that is strongly bonded to oxygen, in addition to In and Zn. The oxide semiconductor preferably contains at least one of gallium (Ga), tin (Sn), zirconium (Zr), hafnium (Hf), and aluminum (Al) as the stabilizer.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor used for the semiconductor layer of the transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide with an atomic ratio of In:Ga:Zn=1:1:1, In:Ga:Zn=3:1:2, or In:Ga:Zn=2:1:3, or an oxide having a composition in the neighborhood of the above compositions is preferably used.

When the oxide semiconductor film forming the semiconductor layer contains a large amount of hydrogen, the hydrogen and the oxide semiconductor are bonded to each other, so that part of the hydrogen serves as a donor and causes generation of an electron serving as a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film may be reduced by the dehydration treatment (dehydrogenation treatment). Therefore, it is preferable that oxygen be added to the oxide semiconductor to fill the oxygen vacancies increased in the dehydration treatment (dehydrogenation treatment) on the oxide semiconductor film. In this specification and the like, supplying oxygen to the oxide semiconductor film may be expressed as oxygen adding treatment, and making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be an i-type (intrinsic) or substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than or equal to $1 \times 10^{17}/cm^3$, lower than or equal to $1 \times 10^{16}/cm^3$, lower than or equal to $1 \times 10^{15}/cm^3$, lower than or equal to $1 \times 10^{14}/cm^3$, or lower than or equal to $1 \times 10^{13}/cm^3$.

Further, the transistor including an i-type (intrinsic) or substantially i-type oxide semiconductor film can have extremely favorable off-state current characteristics. For example, the drain current at the time when the transistor including an oxide semiconductor film is in an off-state at room temperature (approximately 25° C.) can be less than or equal to $1 \times 10^{-18}$ A, preferably less than or equal to $1 \times 10^{-21}$ A, and more preferably $1 \times 10^{-24}$ A; or at 85° C., less than or equal to $1 \times 10^{-15}$ A, preferably $1 \times 10^{-18}$ A, more preferably less than or equal to $1 \times 10^{-21}$ A. An off state of a transistor refers to a state where a gate voltage is much lower than the threshold voltage in an n-channel transistor. Specifically, when the gate voltage is lower than the threshold voltage by 1 V or more, 2 V or more, or 3 V or more, the transistor is off.

A structure of an oxide semiconductor film will be described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal arrangement in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor using the CAAC-OS film, change in electric characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

This embodiment can be implemented in combination with any of the other embodiments as appropriate.

(Embodiment 6)

In this embodiment, a cross-sectional structure of a transistor that is used in a circuit portion included in a programmable switch element in the PLD of one embodiment of the disclosed invention will be described with reference to drawings.

Figure 15:
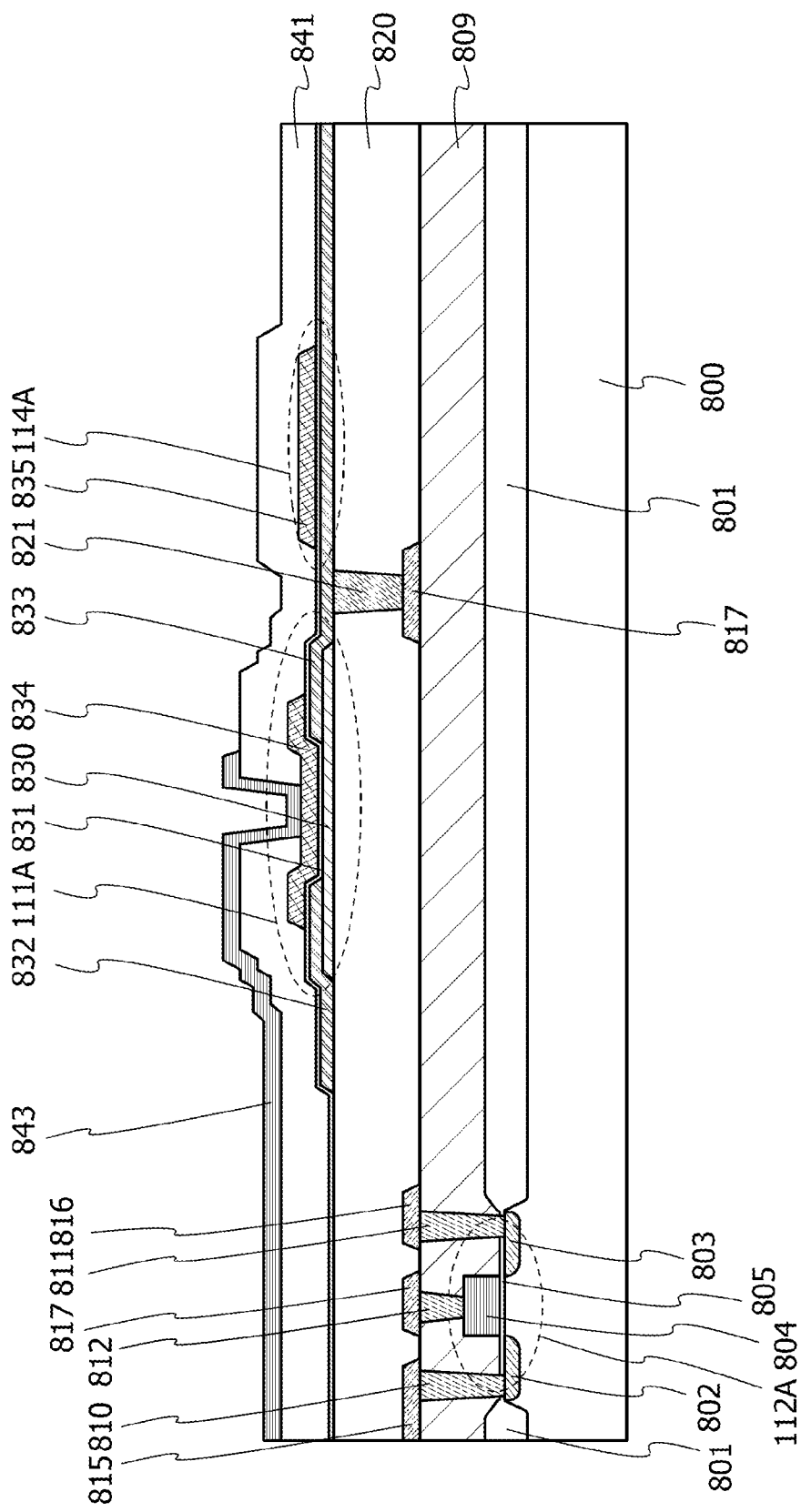
FIG. 15 illustrates a cross section of a semiconductor device.

FIG. 15 illustrates part of a cross-sectional structure of a circuit portion of one embodiment of the present invention. In FIG. 15, the transistor 111A, the capacitor 114A, and the transistor 112A illustrated in Embodiment 3 are illustrated.

In this embodiment, the case where the transistor 112A is formed in a single crystal silicon substrate, and the transistor 111A in which an oxide semiconductor is used for its active layer is formed over the transistor 112A is illustrated. The transistor 112A may include a semiconductor thin film of silicon, germanium, or the like in an amorphous, microcrystalline, polycrystalline, or signal crystal state as an active layer. Alternatively, the active layer in the transistor 112A may be formed using an oxide semiconductor. In the case where an oxide semiconductor is used for active layers of all the transistors, the transistor 111A is not necessarily stacked over the transistor 112A, and the transistors 111A and 112A may be formed in the same layer.

In the case where the transistor 112A is formed using a thin silicon film, any of the following can be used: amorphous silicon formed by a sputtering method or a vapor phase growth method such as a plasma CVD method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

In the case where, among transistors included in the programmable switch elements 100 described in Embodiment 1, the transistors 111A and 116A are formed using an oxide semiconductor and the other transistors including the transistor 112A are formed using silicon, the number of transistors using an oxide semiconductor is smaller than that of transistors using silicon. Thus, the transistors 111A and 116A are stacked over the transistors using silicon, whereby design rules of the transistors 111A and 116A can be flexible.

The chip area of the PLD can be reduced with the use of such a register in which a transistor using silicon and a transistor using an oxide semiconductor are stacked. Since the number of transistors using silicon is larger than that of transistors using an oxide semiconductor in one circuit block, the actual chip area of the PLD depends on the number of transistors using silicon.

Although an oxide semiconductor film can be formed by a sputtering method or a plasma chemical vapor deposition (CVD) method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma to form a film.

Deposition by a thermal CVD method may be performed in such a manner that a source gas and an oxidizer are supplied to a chamber at a time, the pressure in the chamber is set to an atmospheric pressure or a reduced pressure, and they are made to react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on a surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust the film thickness and thus is suitable for manufacturing a minute FET.

The variety of films such as the conductive film and the semiconductor film which are described in the above embodiment can be formed by a thermal CVD method such as a MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: Ga $(C_2H_5)_3$) can be used instead of trimethylgallium, and diethylzinc (chemical formula: Zn $(C_2H_5)_2$) can be used instead of dimethylzinc.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an InO layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of any of these gases. Note that although an $H_2O$ gas which is obtained by bubbling with an inert gas such as Ar may be used instead of an $O_3$ gas, it is preferable to use an $O_3$ gas which does not contain H. Alternatively, instead of an $In(CH_3)_3$ gas, an $In(C_2H_5)_3$ gas may be used. Instead of a $Ga(CH_3)_3$ gas, a $Ga(C_2H_5)_3$ gas may be used. Instead of an $In(CH_3)_3$ gas, an $In(C_2H_5)_3$ may be used. Still alternatively, a $Zn(CH_3)_2$ gas may be used.

In FIG. 15, the n-channel transistor 112A is formed using a semiconductor substrate 800.

The semiconductor substrate 800 can be, for example, a silicon substrate having n-type or p-type conductivity, a germanium substrate, a silicon germanium substrate, a compound semiconductor substrate (e.g., a GaAs substrate, an InP substrate, a GaN substrate, a SiC substrate, a GaP substrate, a GaInAsP substrate, or a ZnSe substrate), or the like. FIG. 15 illustrates an example in which a single crystal silicon substrate having n-type conductivity is used.

The transistor 112A is electrically isolated from the other transistors by an element isolation insulating film 801. The element isolation insulating film 801 can be formed by a selective oxidation method such as a local oxidation of silicon (LOCOS) method, a trench isolation method, or the like.

Specifically, the transistor 112A includes impurity regions 802 and 803 that are formed in the semiconductor substrate 800 and function as source and drain regions, a gate electrode 804, and a gate insulating film 805 provided between the semiconductor substrate 800 and the gate electrode 804. The gate electrode 804 overlaps with a channel formation region formed between the impurity regions 802 and 803, with the gate insulating film 805 laid between the gate electrode 804 and the channel formation region.

An insulating film 809 is provided over the transistor 112A. Openings are formed in the insulating film 809. A wiring 810 in contact with the impurity region 802, a wiring 811 in contact with the impurity region 803, and a wiring 812 in contact with the gate electrode 804 are formed in the openings.

The wiring 810 is connected to a wiring 815 formed over the insulating film 809. The wiring 811 is connected to a wiring 816 formed over the insulating film 809. The wiring 812 is connected to a wiring 817 formed over the insulating film 809.

An insulating film 820 is formed over the wirings 815 to 817. An opening is formed in the insulating film 820, and a wiring 821 is formed in the opening so as to be connected to the wiring 817.

In FIG. 15, the transistor 111A and the capacitor 114A are formed over the insulating film 820.

The transistor 111A includes a semiconductor film 830 containing an oxide semiconductor over the insulating film 820; conductive films 832 and 833 which function as source and drain electrodes and are provided over the semiconductor film 830; a gate insulating film 831 over the semiconductor film 830, the conductive film 832, and the conductive film 833; and a gate electrode 834 which is provided over the gate insulating film 831 and overlaps with the semiconductor film 830 in the region between the conductive films 832 and 833. The conductive film 833 is connected to the wiring 821.

A conductive film 835 is provided over the gate insulating film 831 so as to overlap with the conductive film 833. A portion where the conductive film 835 overlaps with the conductive film 833 with the gate insulating film 831 placed therebetween functions as the capacitor 114A.

Although the capacitor 114A is provided over the insulating film 820 together with the transistor 111A in FIG. 15, the capacitor 114A may be provided below the insulating film 820 together with the transistor 112A.

An insulating film 841 is provided over the transistor 111A and the capacitor 114A. An opening is formed in the insulating film 841. A conductive film 843 that is in contact with the gate electrode 834 in the opening is provided over the insulating film 841.

In FIG. 15, the transistor 111A includes the gate electrode 834 on at least one side of the semiconductor film 830. Alternatively, the transistor 111A may include a pair of gate electrodes with the semiconductor film 830 placed therebetween.

In the case where the transistor 111A has a pair of gate electrodes with the semiconductor film 830 provided therebetween, one of the gate electrodes may be supplied with a signal for controlling on/off of the transistor 111A, and the other of the gate electrodes may be supplied with a potential from another element. In the latter case, potentials with the same level may be supplied to the pair of electrodes, or a fixed potential such as a ground potential may be supplied only to the other of the gate electrodes. When the level of a potential supplied to the other of the gate electrodes is controlled, the threshold voltage of the transistor 111A can be controlled.

The semiconductor film 830 is not limited to a single oxide semiconductor film and may have a structure including a plurality of oxide semiconductor films which are stacked. For example, FIG. 16A illustrates a structural example of the transistor 111A in which the semiconductor film 830 has a three-layer structure.

Figure 16A:
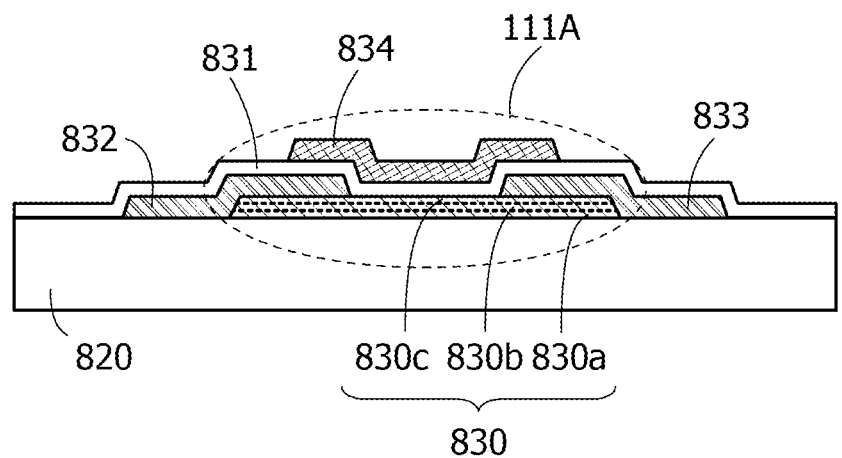
FIGS. 16A and 16B illustrate cross sections of semiconductor devices.

The transistor 111A illustrated in FIG. 16A includes the semiconductor film 830 provided over the insulating film 820 or the like; a conductive film 832 and a conductive film 833 electrically connected to the semiconductor film 830; a gate insulating film 831; and a gate electrode 834 provided over the gate insulating film 831 so as to overlap with the semiconductor film 830.

As the semiconductor film 830 in the transistor 111A, oxide semiconductor layers 830a to 830c are stacked in this order from the insulating film 820 side.

The oxide semiconductor layers 830a and 830c are each an oxide film that contains at least one of metal elements contained in the oxide semiconductor layer 830b. The energy at the bottom of the conduction band of the oxide semiconductor layers 830a and 830c is closer to a vacuum level than that of the oxide semiconductor layer 830b by 0.05 eV or more, 0.07 eV or more, 0.1 eV or more, or 0.15 eV or more and 2 eV or less, 1 eV or less, 0.5 eV or less, or 0.4 eV or less. The oxide semiconductor layer 830b preferably contains at least indium to increase carrier mobility.

Figure 16B:
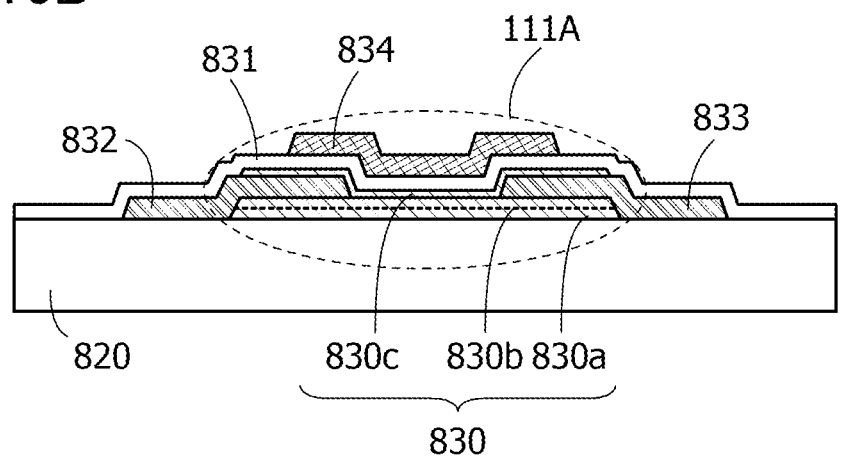

The oxide semiconductor layer 830c may be provided over the conductive film 832 and the conductive film 833 so as to overlap with the gate insulating film 831 as illustrated in FIG. 16B.

This embodiment can be implemented in combination with any of the other embodiments as appropriate.

(Embodiment 7)

In this embodiment, application examples of a circuit including the PLD described in the above embodiment to an electronic component and to an electronic device including the electronic component will be described with reference to FIGS. 17A and 17B and FIGS. 18A to 18E.

Figure 17A:
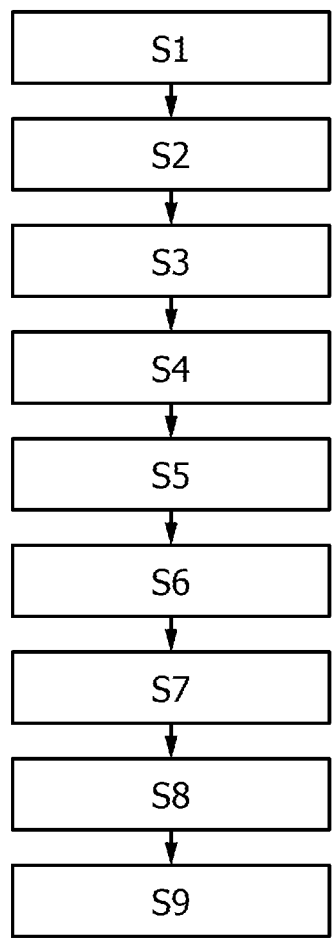
FIG. 17A is a flow chart showing fabricating steps of a semiconductor device.

FIG. 17A shows an example where a semiconductor device including the PLD described in the above embodiment is used as an electronic component. Note that an electronic component is also referred to as semiconductor package or an IC package. This electronic component has a plurality of standards and names depending on a terminal extraction direction and a terminal shape. Thus, examples of the electronic component will be described in this embodiment.

A circuit portion including the transistor illustrated in FIG. 15 in Embodiment 6 is completed via an assembly process (post-process) in which the circuit portion is combined with a plurality of detachable components on a printed circuit board.

The post-process can be completed through steps shown in FIG. 17A. Specifically, after an element substrate is completed via the pre-process (Step S1), a back surface of the substrate is ground (Step S2). The substrate is thinned in this step to reduce warpage or the like of the substrate in the pre-process and to reduce the size of the component itself.

A dicing step of grinding the back surface of the substrate to separate the substrate into a plurality of chips is performed. Then, a die bonding step of individually picking up separate chips to be mounted on and bonded to a lead frame is performed (Step S3). To bond a chip and a lead frame in the die bonding step, a method such as resin bonding or tape-automated bonding is selected as appropriate depending on products. Note that in the die bonding step, a chip may be mounted on an interposer to be bonded.

Next, wiring bonding for electrically connecting a lead of the lead frame and an electrode on a chip through a metal wire is performed (Step S4). As the metal wire, a silver wire or a gold wire can be used. For wire bonding, ball bonding or wedge bonding can be employed.

A wire-bonded chip is subjected to a molding step of sealing the chip with an epoxy resin or the like (Step S5). Through the molding step, the inside of the electronic component is filled with a resin, so that the circuit portion and the wire embedded in the component can be protected from external mechanical force and degradation of characteristics due to moisture or dust can be reduced.

Subsequently, the lead of the lead frame is plated. Then, the lead is cut and processed into a predetermined shape (Step S6). Through the plating process, corrosion of the lead can be prevented, and soldering for mounting the electronic component on a printed circuit board in a later step can be performed with higher reliability.

Next, a printing process (marking) is performed on a surface of the package (Step S7). Then, through a final test step (Step S8), the electronic component that includes the circuit portion including the PLD is completed (Step S9).

The electronic component described above can include the circuit portion including the PLD described in the above embodiment. Thus, the electronic component can have a reduced circuit area and an increased operation speed.

Figure 17B:
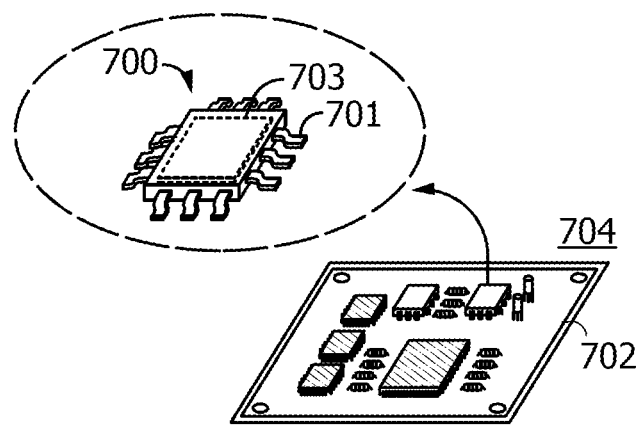
FIG. 17B is a perspective schematic diagram of the semiconductor device.

FIG. 17B is a perspective schematic diagram of a completed electronic component. FIG. 17B shows a perspective schematic diagram of a quad flat package (QFP) as an example of the electronic component. A lead 701 and a circuit portion 703 of an electronic component 700 are illustrated in FIG. 17B. The electronic component 700 in FIG. 17B is, for example, mounted on a printed circuit board 702. A plurality of the electronic components 700 are used in combination and electrically connected to each other on the printed circuit board 702, so that a semiconductor device is completed. A completed semiconductor device 704 is provided inside an electronic device or the like.

Next, descriptions will be given of applications of the above electronic component to electronic devices such as a computer, a portable information terminal (e.g., a mobile phone, a portable game machine, an audio reproducing device, and the like), electronic paper, a television device (also referred to as a television or a television receiver), and a digital video camera.

Figure 18A:
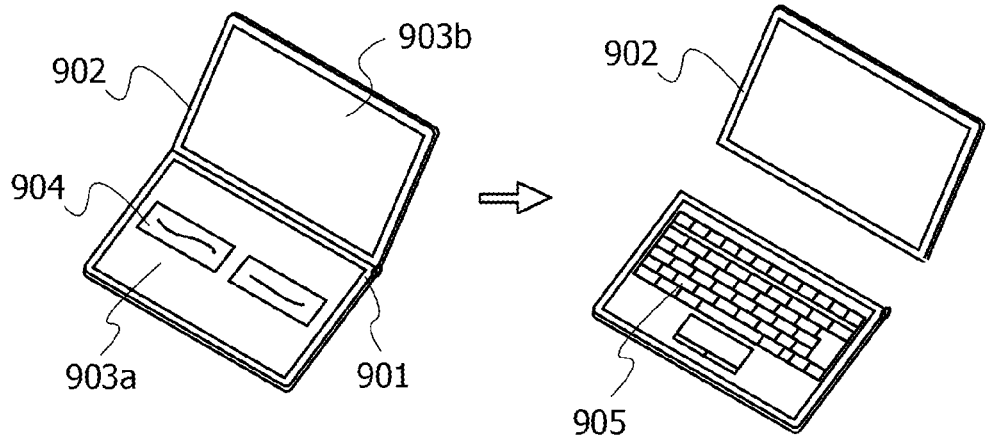
FIGS. 18A to 18E illustrate electronic devices using semiconductor devices.

FIG. 18A illustrates a portable information terminal that includes a housing 901, a housing 902, a first display portion 903a, a second display portion 903b, and the like. The semiconductor device including the PLD described in the above embodiment is provided inside at least part of the housings 901 and 902. Thus, the portable information terminal can have a reduced circuit area and an increased operation speed.

Note that the first display portion 903a is a touch panel, and for example, as illustrated in the left of FIG. 18A, which of "touch input" and "keyboard input" is performed can be selected by a selection button 904 displayed on the first display portion 903a. Since the selection buttons with a variety of sizes can be displayed, the portable information terminal can be easily used by people of any generation. For example, when "touch input" is selected, a keyboard 905 is displayed on the first display portion 903a as illustrated in the right of FIG. 18A. With such a structure, text can be input quickly by keyboard input as in the case of using a conventional information terminal, for example.

One of the first display portion 903a and the second display portion 903b can be detached from the portable information terminal as illustrated in the right of FIG. 18A. Providing the first display portion 903a with a touch input function makes the information terminal convenient to carry because the weight can be further reduced and to operate with one hand while the other hand supports the housing 902.

The portable information terminal illustrated in FIG. 18A has a function of displaying various kinds of data (e.g., a still image, a moving image, and a text image) on the display portion, a function of displaying a calendar, a date, the time, or the like on the display portion, a function of operating or editing the data displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 18A may transmit and receive data wirelessly. Through wireless communication, desired book data or the like can be purchased and downloaded from an e-book server.

Further, the housing 902 illustrated in FIG. 18A may be equipped with an antenna, a microphone function, or a wireless communication function to be used as a mobile phone.

Figure 18B:
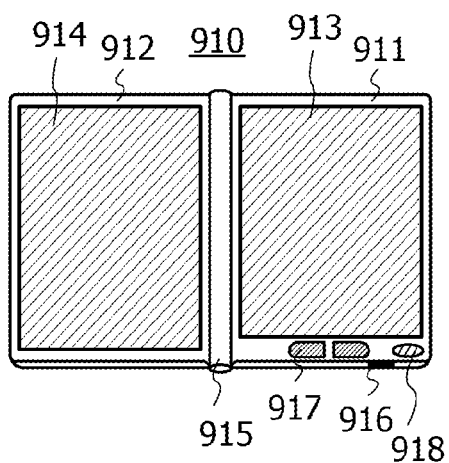

FIG. 18B illustrates an e-book reader 910 in which electronic paper is incorporated. The e-book reader includes two housings of a housing 911 and a housing 912. The housing 911 and the housing 912 are provided with a display portion 913 and a display portion 914, respectively. The housings 911 and 912 are connected by a hinge portion 915 and can be opened or closed with the hinge portion 915 as an axis. The housing 911 is provided with a power switch 916, an operation key 917, a speaker 918, and the like. At least one of the housing 911 and the housing 912 is provided with a semiconductor device including the PLD described in the above embodiment. Thus, the e-book reader can have a reduced circuit area and an increased operation speed.

Figure 18C:
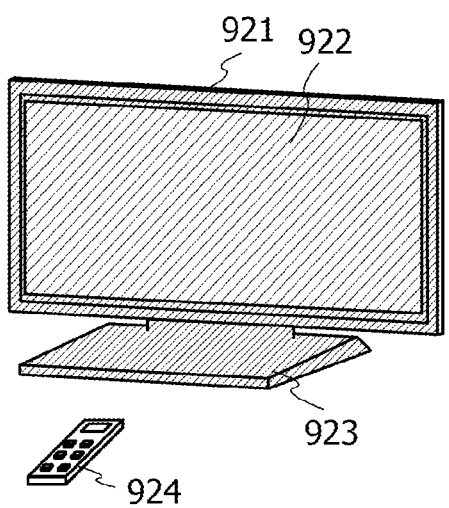

FIG. 18C illustrates a television device including a housing 921, a display portion 922, a stand 923, and the like. The television device 920 can operate with a switch of the housing 921 and a remote controller 924. A semiconductor device including the PLD described in the above embodiment is provided in the housing 921 and the remote controller 924. Thus, the television device can have a reduced circuit area and an increased operation speed.

Figure 18D:
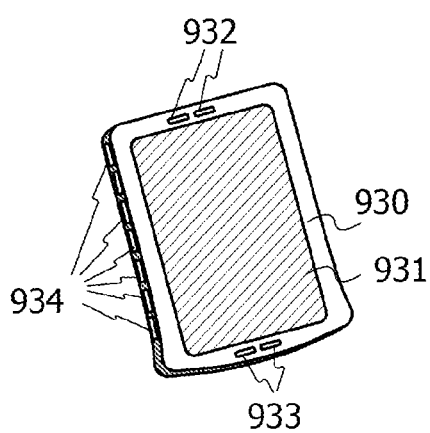

FIG. 18D illustrates a smartphone in which a main body 930 is provided with a display portion 931, a speaker 932, a microphone 933, operation keys 934, and the like. A semiconductor device including the PLD described in the above embodiment is provided in the main body 930. Thus, the smartphone can have a reduced circuit area and an increased operation speed.

Figure 18E:
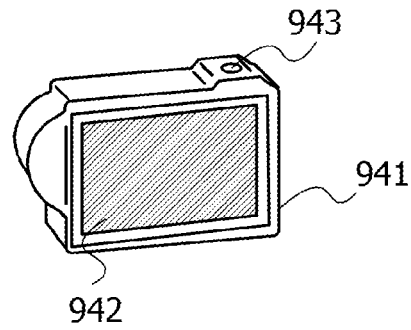

FIG. 18E illustrates a digital camera including a main body 941, a display portion 942, an operation switch 943, and the like. A semiconductor device including the PLD described in the above embodiment is provided in the main body 941. Thus, the digital camera can have a reduced circuit area and an increased operation speed.

As described above, any of the PLDs of the above embodiments is provided in the electronic devices described in this embodiment. Thus, the electronic devices can each have a reduced circuit area and an increased operation speed.

(Embodiment 8)

In this embodiment, an application example of using the programmable logic device described above for software processing in a portable terminal will be described.

A communication protocol (specifications) used for communication for portable terminals may be changed, for example, when it is found that any other communication protocol interferes communication and thus the working frequency band is varied. A reduced period of a product development cycle and rapid progress of communication technology require development of new products for a new communication protocol at the stage where the communication protocol is not yet determined. For this reason, in the case where a communication LSI is formed of a dedicated LSI (ASIC), there is a possibility that huge costs be taken for a mask change, reproduction of a dedicated LSI, or the like due to a communication protocol change. In the case where processing of a communication LSI is performed by software processing of a CPU, processing performance satisfying the communication protocol (specifications) is difficult to obtain and power consumption might increase.

Therefore, it is effective that a portable terminal including the programmable logic device described in the above embodiment as a communication LSI be employed, and a circuit structure of a programmable logic device including an OS memory be changed to correspond to a new communication protocol so that image processing can be performed with a circuit structure suitable for the communication protocol when a communication protocol is changed.

The programmable logic device described in the above embodiment does not require rewriting of configuration data on starting, enabling high-speed startup of a portable terminal. This is preferable particularly for a portable terminal where power supply is frequently stopped to reduce power consumption and rapid startup is required for keyboard input by a user. It is effective that, in a communication LSI, communication signals be monitored at regular intervals and the communication LSI fully operate when a communication signal is sensed. Thus, it is advantageous that a communication LSI start operation fast.

EXPLANATION OF REFERENCE

A1: control terminal, A2: input terminal, A3: input terminal, A4: input terminal, A5: input terminal, A6: control terminal, A7: input terminal, A8: input terminal, BL: bit line, BL1: bit line, C1: capacitance, C2: capacitance, C3: capacitance, C4: capacitance, CL: selection line, CL_A: selection line, CL_B: selection line, CL_$m$: selection line, CL_1: selection line, CL_2: selection line, CL1: selection line, in1: input terminal, in2: input terminal, in3: input terminal, in4: input terminal, IN: input terminal, IN_$k$: input terminal, IN_1: input terminal, IN1: input terminal, M1: input terminal, M8: input terminal, N11_A: node, N11_B: node, N12_A: node, N12_B: node, N21_A: node, N21_B: node, N22_A: node, N22_B: node, N3_A: node, N31_B: node, N32_A: node, N32_B: node, OUT: output terminal, OUT1: output terminal, OUT2: output terminal, OUTS: output terminal, out: output terminal, T100: time, T101: time, T102: time, T200: time, T201: time, T300: time, T301: time, T302: time, T400: time, T401: time, T402: time, WL: word line, WL_A: word line, WL_B: word line, WL_A1: word line, WL_A2: word line, WL_A8: word line, WL_B1: word line, WL_B2: word line, WL_B8: word line, WL_$m$: word line, WL_1: word line, WL_2: word line, 31: multiplexer, 32: multiplexer, 33: multiplexer, 34: multiplexer, 35: multiplexer, 36: multiplexer, 37: multiplexer, 41: multiplexer, 42: multiplexer, 43: multiplexer, 44: OR circuit, 100: programmable switch element, 100_$k$: programmable switch element, 100_1: programmable switch element, 101_$m$: configuration data storage circuit, 101_1: configuration data storage circuit, 101_2: configuration data storage circuit, 101A: configuration data storage circuit, 101B: configuration data storage circuit, 102_$m$: context selection circuit, 102_1: context selection circuit, 102_2: context selection circuit, 102A: context selection circuit, 102B: context selection circuit, 110: switch circuit, 111_$m$: transistor, 111_1: transistor, 111_2: transistor, 111A: transistor, 111B: transistor, 112: transistor, 112_$m$: transistor, 112_1: transistor, 1122: transistor, 112A: transistor, 112B: transistor, 113_$m$: node, 113_1: node, 113_2: node, 113A: node, 113B: node, 114A: capacitor, 114B: capacitor, 116: transistor, 116_$m$: transistor, 116_1: transistor, 1162: transistor, 116A: transistor, 116B: transistor, 117: transistor, 117_$m$: transistor, 117_1: transistor, 1172: transistor, 117A: transistor, 117B: transistor, 118: node, 118_$m$: node, 118_1: node, 118_2: node, 118A: node, 118B: node, 124: wiring, 124_1: wiring, 124_2: wiring, 124_3: wiring, 130: PLD, 131: programmable logic element, 131_1: programmable logic element, 132: wiring, 133: wiring, 133_1: wiring, 133_2: wiring, 133_3: wiring, 134: wiring, 134_1: wiring, 134_2: wiring, 134_3: wiring, 135: wiring, 135_1: wiring, 135_2: wiring, 135_3: wiring, 136: wiring, 137: wiring, 138: wiring, 140_1: column, 140_2: column, 140_3: column, 150: programmable switch element, 150_1: programmable switch element, 1502: programmable switch element, 1503: programmable switch element, 160: LUT, 161: flip-flop, 162: configuration memory, 163: input terminal, 164: output terminal, 165: output terminal, 168: multiplexer, 169: configuration memory, 200: programmable switch element, 200_1: programmable switch element, 200_2: programmable switch element, 200_8: programmable switch element, 201_1: programmable switch element, 201_8: programmable switch element, 501: signal, 502: signal, 503: signal, 700: electronic component, 701: lead, 702: printed circuit board, 703: circuit portion, 704: semiconductor device, 800: semiconductor substrate, 801: element isolation insulating film, 802: impurity region, 803: impurity region, 804: gate electrode, 805: gate insulating film, 809: insulating film, 810: wiring, 811: wiring, 812: wiring, 815: wiring, 816: wiring, 817: wiring, 820: insulating film, 821: wiring, 830: semiconductor film, 831: gate insulating film, 832: conductive film, 833: conductive film, 834: gate electrode, 835: conductive film, 841: insulating film, 843: conductive film, 901: housing, 902: housing, 903$a$: display portion, 903$b$: display portion, 904: selection button, 905: keyboard, 910: e-book reader, 911: housing, 912: housing, 913: display portion, 914: display portion, 915: hinge portion, 916: power switch, 917: operation key, 918: speaker, 920: television device, 921: housing, 922: display portion, 923: stand, 924: remote controller, 930: main body, 931: display portion, 932: speaker, 933: microphone, 934: operation key, 941: main body, 942: display portion, 943: operation switch This application is based on Japanese Patent Application serial no. 2013-025087 filed with Japan Patent Office on Feb. 13, 2013, the entire contents of which are hereby incorporated by reference.

The invention claimed is:
1. A programmable logic device comprising:
   a programmable switch element comprising:
      an input terminal;
      an output terminal;
      a first transistor;
      a second transistor;

an insulating film over the first transistor and the second transistor;
a third transistor over the insulating film;
a fourth transistor over the insulating film;
a fifth transistor;
a sixth transistor;
a seventh transistor over the insulating film; and
an eighth transistor over the insulating film,
wherein a first terminal of the first transistor is electrically connected to the input terminal,
wherein a second terminal of the first transistor and a first terminal of the second transistor are electrically connected to each other,
wherein a second terminal of the second transistor is electrically connected to the output terminal,
wherein a first terminal of the third transistor is electrically connected to a gate of the first transistor,
wherein a first terminal of the fourth transistor is electrically connected to a gate of the second transistor,
wherein a first terminal of the fifth transistor is electrically connected to the input terminal,
wherein a second terminal of the fifth transistor and a first terminal of the sixth transistor are electrically connected to each other,
wherein a second terminal of the sixth transistor is electrically connected to the output terminal,
wherein a first terminal of the seventh transistor is electrically connected to a gate of the fifth transistor,
wherein a first terminal of the eighth transistor is electrically connected to a gate of the sixth transistor,
wherein a second terminal of the third transistor and a second terminal of the seventh transistor are electrically connected to each other, and
wherein a gate of the fourth transistor and a gate of the eighth transistor are electrically connected to each other.

2. The programmable logic device according to claim 1,
wherein the third transistor comprises a channel formation region comprising an oxide semiconductor, and
wherein the fourth transistor comprises a channel formation region comprising an oxide semiconductor.

3. The programmable logic device according to claim 2,
wherein the oxide semiconductor of the channel formation region of the third transistor comprises In, Ga, and Zn, and
wherein the oxide semiconductor of the channel formation region of the fourth transistor comprises In, Ga, and Zn.

4. The programmable logic device according to claim 1, further comprising a first programmable logic element and a second programmable logic element,
wherein an output terminal of the first programmable logic element is electrically connected to the input terminal of the programmable switch element, and
wherein an input terminal of the second programmable logic element is electrically connected to the output terminal of the programmable switch element.

5. The programmable logic device according to claim 4,
wherein the first programmable logic element comprises a first configuration memory configured to store first configuration data,
wherein a function of the first programmable logic element is changed in accordance with the first configuration data,
wherein the second programmable logic element comprises a second configuration memory configured to store second configuration data,
wherein a function of the second programmable logic element is changed in accordance with the second configuration data,
wherein the programmable switch element comprises a node configured to store third configuration data, and
wherein a connection between the input terminal of the programmable switch element and the output terminal of the programmable switch element is changed in accordance with the third configuration data.

6. A semiconductor device comprising the programmable logic device according to claim 1.

7. A programmable logic device comprising:
a first programmable switch element and a second programmable switch element each comprising:
an input terminal;
an output terminal;
a first transistor;
a second transistor;
an insulating film over the first transistor and the second transistor;
a third transistor over the insulating film;
a fourth transistor over the insulating film;
a fifth transistor;
a sixth transistor;
a seventh transistor over the insulating film; and
an eighth transistor over the insulating film,
wherein a first terminal of the first transistor is electrically connected to the input terminal,
wherein a second terminal of the first transistor and a first terminal of the second transistor are electrically connected to each other,
wherein a second terminal of the second transistor is electrically connected to the output terminal,
wherein a first terminal of the third transistor is electrically connected to a gate of the first transistor,
wherein a first terminal of the fourth transistor is electrically connected to a gate of the second transistor,
wherein the input terminal of the first programmable switch element and the input terminal of the second programmable switch element are electrically connected to each other,
wherein a second terminal of the third transistor of the first programmable switch element and a second terminal of the third transistor of the second programmable switch element are electrically connected to each other,
wherein a first terminal of the fifth transistor is electrically connected to the input terminal,
wherein a second terminal of the fifth transistor and a first terminal of the sixth transistor are electrically connected to each other,
wherein a second terminal of the sixth transistor is electrically connected to the output terminal,
wherein a first terminal of the seventh transistor is electrically connected to a gate of the fifth transistor,
wherein a first terminal of the eighth transistor is electrically connected to a gate of the sixth transistor,
wherein a second terminal of the third transistor and a second terminal of the seventh transistor are electrically connected to each other, and
wherein a gate of the fourth transistor and a gate of the eighth transistor are electrically connected to each other.

8. The programmable logic device according to claim 7,
wherein the third transistor comprises a channel formation region comprising an oxide semiconductor, and
wherein the fourth transistor comprises a channel formation region comprising an oxide semiconductor.

9. The programmable logic device according to claim 7, further comprising a first programmable logic element, a second programmable logic element, and a third programmable logic element,
  wherein an output terminal of the first programmable logic element is electrically connected to the input terminal of the first programmable switch element and the input terminal of the second programmable switch element,
  wherein an input terminal of the second programmable logic element is electrically connected to the output terminal of the first programmable switch element, and
  wherein an input terminal of the third programmable logic element is electrically connected to the output terminal of the second programmable switch element.

10. The programmable logic device according to claim 9,
  wherein the first programmable logic element comprises a first configuration memory configured to store first configuration data,
  wherein a function of the first programmable logic element is changed in accordance with the first configuration data,
  wherein the second programmable logic element comprises a second configuration memory configured to store second configuration data,
  wherein a function of the second programmable logic element is changed in accordance with the second configuration data,
  wherein the third programmable logic element comprises a third configuration memory configured to store third configuration data,
  wherein a function of the third programmable logic element is changed in accordance with the third configuration data,
  wherein the first programmable switch element comprises a node configured to store fourth configuration data,
  wherein a connection between the input terminal of the first programmable switch element and the output terminal of the first programmable switch element is changed in accordance with the fourth configuration data,
  wherein the second programmable switch element comprises a node configured to store fifth configuration data, and
  wherein a connection between the input terminal of the second programmable switch element and the output terminal of the second programmable switch element is changed in accordance with the fifth configuration data.

11. A programmable logic device comprising:
  a first programmable switch element and a second programmable switch element each comprising:
    an input terminal;
    an output terminal;
    a first transistor;
    a second transistor;
    an insulating film over the first transistor and the second transistor;
    a third transistor over the insulating film;
    a fourth transistor over the insulating film;
    a fifth transistor;
    a sixth transistor;
    a seventh transistor over the insulating film; and
    an eighth transistor over the insulating film,
  wherein a first terminal of the first transistor is electrically connected to the input terminal,
  wherein a second terminal of the first transistor and a first terminal of the second transistor are electrically connected to each other,
  wherein a second terminal of the second transistor is electrically connected to the output terminal,
  wherein a first terminal of the third transistor is electrically connected to a gate of the first transistor,
  wherein a first terminal of the fourth transistor is electrically connected to a gate of the second transistor,
  wherein the output terminal of the first programmable switch element and the output terminal of the second programmable switch element are electrically connected to each other,
  wherein a second terminal of the fourth transistor of the first programmable switch element and a second terminal of the fourth transistor of the second programmable switch element are electrically connected to each other,
  wherein a first terminal of the fifth transistor is electrically connected to the input terminal,
  wherein a second terminal of the fifth transistor and a first terminal of the sixth transistor are electrically connected to each other,
  wherein a second terminal of the sixth transistor is electrically connected to the output terminal,
  wherein a first terminal of the seventh transistor is electrically connected to a gate of the fifth transistor,
  wherein a first terminal of the eighth transistor is electrically connected to a gate of the sixth transistor,
  wherein a second terminal of the third transistor and a second terminal of the seventh transistor are electrically connected to each other, and
  wherein a gate of the fourth transistor and a gate of the eighth transistor are electrically connected to each other.

12. The programmable logic device according to claim 11,
  wherein the third transistor comprises a channel formation region comprising an oxide semiconductor, and
  wherein the fourth transistor comprises a channel formation region comprising an oxide semiconductor.

13. The programmable logic device according to claim 11, further comprising a first programmable logic element, a second programmable logic element, and a third programmable logic element,
  wherein an output terminal of the first programmable logic element is electrically connected to the input terminal of the first programmable switch element,
  wherein an output terminal of the second programmable logic element is electrically connected to the input terminal of the second programmable switch element, and
  wherein an input terminal of the third programmable logic element is electrically connected to the output terminal of the first programmable switch element and the output terminal of the second programmable switch element.

14. The programmable logic device according to claim 13,
  wherein the first programmable logic element comprises a first configuration memory configured to store first configuration data,
  wherein a function of the first programmable logic element is changed in accordance with the first configuration data,
  wherein the second programmable logic element comprises a second configuration memory configured to store second configuration data,
  wherein a function of the second programmable logic element is changed in accordance with the second configuration data,
  wherein the third programmable logic element comprises a third configuration memory configured to store third configuration data, wherein a function of the third programmable logic element is changed in accordance with the third configuration data, wherein the first programmable switch element comprises a node configured to store fourth configuration data, wherein a connection between the input terminal of the first programmable switch element and the output terminal of the first programmable switch element is changed in accordance with the fourth configuration data, wherein the second programmable switch element comprises a node configured to store fifth configuration data, and wherein a connection between the input terminal of the second programmable switch element and the output terminal of the second programmable switch element is changed in accordance with the fifth configuration data.

* * * * *